US012787315B2

(12) United States Patent
Chen et al.

(10) Patent No.: US 12,787,315 B2
(45) Date of Patent: Nov. 3, 2026

(54) METAL-INSULATOR-METAL CAPACITORS

(71) Applicant: Taiwan Semiconductor Manufacturing Company LTD, Hsinchu (TW)

(72) Inventors: Chieh-En Chen, Tainan (TW); Chen-Hsien Lin, Tainan (TW); Shyh-Fann Ting, Tainan (TW); Wei-Chih Weng, Tainan (TW); Hsing-Chih Lin, Tainan (TW); Dun-Nian Yaung, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 529 days.

(21) Appl. No.: 18/219,248

(22) Filed: Jul. 7, 2023

(65) Prior Publication Data

US 2025/0015124 A1 Jan. 9, 2025

(51) Int. Cl.
*H10D 1/68* (2025.01)
*H01G 4/33* (2006.01)
(Continued)

(52) U.S. Cl.
CPC ............... *H10D 1/696* (2025.01); *H01G 4/33* (2013.01); *H10D 1/042* (2025.01); *H10D 1/043* (2025.01); *H10D 1/716* (2025.01); *H10W 20/496* (2026.01)

(58) Field of Classification Search
CPC .......... H10D 1/696; H10D 1/716; H01G 4/33; H10W 20/496
See application file for complete search history.

(56) References Cited

U.S. PATENT DOCUMENTS

2006/0258111 A1 11/2006 Jagueneau et al.
2016/0336311 A1 11/2016 Kim
(Continued)

FOREIGN PATENT DOCUMENTS

| | | | |
|---|---|---|---|
| CN | 107017235 | A | 8/2017 |
| EP | 3901997 | A1 | 10/2021 |
| TW | 202215675 | A | 4/2022 |

OTHER PUBLICATIONS

Taiwan Office Action Dated: Apr. 2, 2024.

*Primary Examiner* — Jose R Diaz
(74) *Attorney, Agent, or Firm* — Lippes Mathias LLP

(57) ABSTRACT

Fabricating a metal-insulator-metal (MIM) capacitor structure includes: forming a patterned metallization layer; disposing a dielectric material on the patterned metallization layer; etching one or more deep trenches through the dielectric material to the patterned metallization layer; depositing a MIM multilayer on the dielectric material and inside the one or more deep trenches formed in the dielectric material; and fabricating at least one three-dimensional MIM (3D-MIM) capacitor comprising a portion of the MIM multilayer deposited inside at least one of the one or more deep trenches; and fabricating at least one second capacitor, including at least one shallow 3D-MIM capacitor comprising a portion of the MIM multilayer deposited inside one or more shallow trenches passing partway through the dielectric material that are shallower than the one or more deep trenches, and/or at least one two-dimensional MIM (2D-MIM) capacitor comprising a portion of the MIM multilayer deposited on the dielectric material.

20 Claims, 20 Drawing Sheets

(51) Int. Cl.

| | |
|---|---|
| ***H10D 1/00*** | (2025.01) |
| ***H10W 20/40*** | (2026.01) |

(56) References Cited

U.S. PATENT DOCUMENTS

| | | | | |
|---|---|---|---|---|
| 2018/0366401 | A1* | 12/2018 | Suo | H10W 70/65 |
| 2021/0332492 | A1* | 10/2021 | Voiron | C25D 11/045 |

* cited by examiner

METAL-INSULATOR-METAL CAPACITORS

BACKGROUND

The following relates to the semiconductor device arts, back end-of-line (BEOL) processing arts, metal-insulator-metal (MIM) capacitor arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
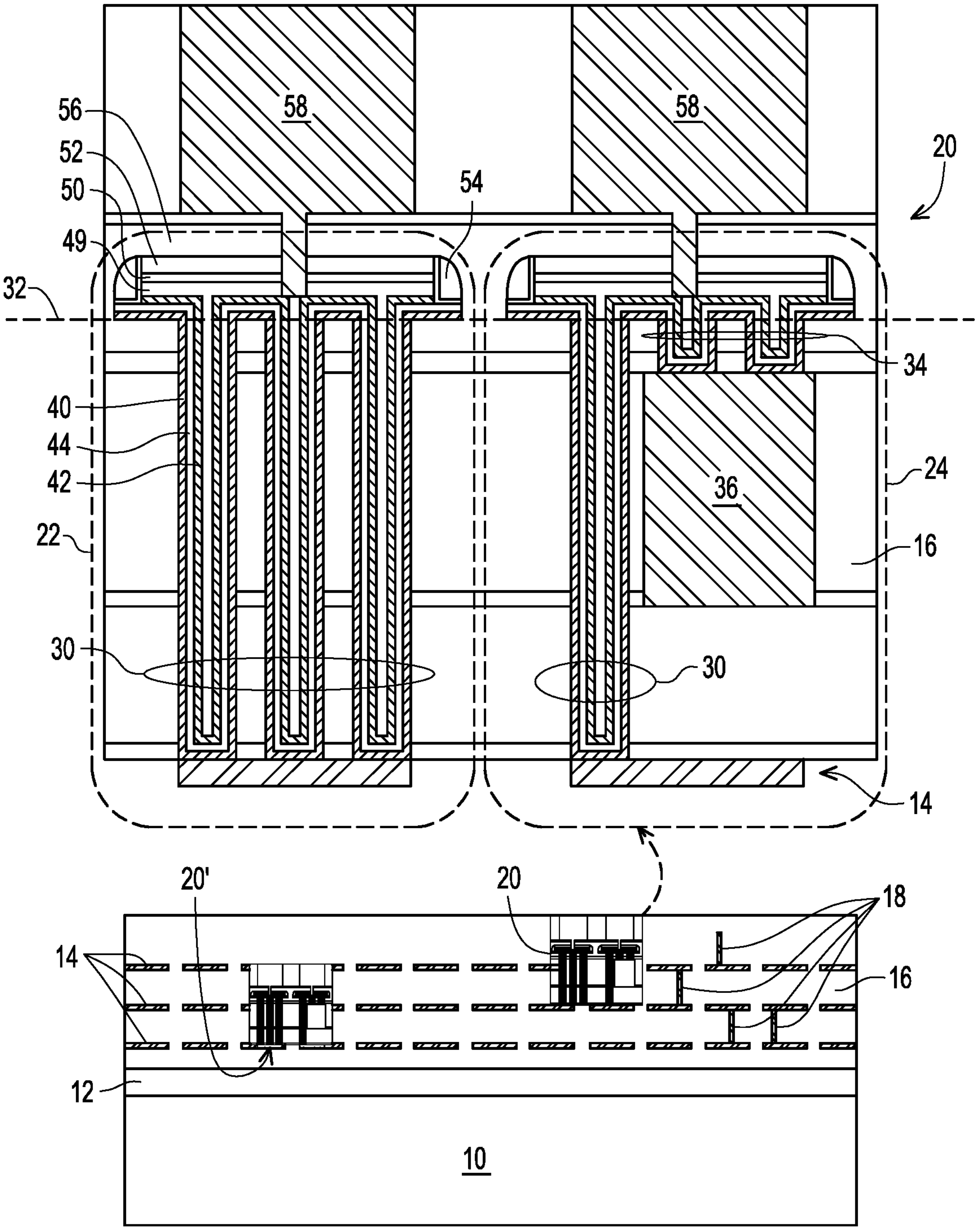
FIG. 1 diagrammatically illustrates a sectional view of two metal-insulator-metal (MIM) capacitors according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference to FIG. 1, a typical manufacturing workflow for fabricating an integrated circuit (IC) includes front end-of-line (FEOL) processing and back end-of-line (BEOL) processing stages. During the FEOL processing, various electronic, optoelectronic, photonic, or other devices such as transistors, photodetectors, and/or so forth are fabricated on and/or in a semiconductor wafer 10 such as a silicon, silicon-on-insulator (SOI), germanium, gallium arsenide (GaAs), or other semiconductor wafer. This produces a layer or region of semiconductor devices 12 on a surface of the semiconductor wafer 10. The BEOL processing follows the FEOL processing, and includes forming a stack of patterned metallization layers 14 spaced apart by intermetal dielectric (IMD) material 16. The patterned metallization layers 14 may, by way of nonlimiting illustrative example, comprise an electrically conductive material such as copper, aluminum, a copper alloy, or an aluminum alloy. The IMD material 16 is typically an oxide, such as silicon dioxide ($SiO_2$) formed by plasma-enhanced atomic layer deposition (PEALD), chemical vapor deposition (CVD), or another deposition technique. Electrically conductive vias 18 pass through the IMD material 16 to interconnect the patterned metallization layers 14. A typical BEOL processing sequence entails successive iterations to build up the stack of patterned metallization layers 14. Each iteration may, for example, include: depositing IMD material on the last patterned metallization layer (or, on the layer or region of semiconductor devices 12 in the case of the initial MO metallization layer); photolithographic processing of the IMD material via openings followed by metal deposition to fill the via openings to form vias; and deposition and photolithographic patterning of the next metallization layer. The stack of patterned metallization layers 14 and interconnecting vias 18 formed during BEOL processing provide electrically conductive circuitry for interconnecting transistors, photodetectors, and/or other devices of the layer or region of semiconductor devices 12 formed on a surface of the semiconductor wafer 10 during the FEOL processing.

The workflow for manufacturing some ICs may also include formation of metal-insulator-metal (MIM) capacitors during the BEOL processing. MIM capacitors formed during the BEOL processing are used, for example, in some analog/logic, analog-to-digital, mixed signal, and radio frequency ICs. The BEOL capacitor can provide various functionality such as frequency filtering (for example, providing the capacitor of an LC filter), power surge suppression, signal decoupling, signal delay, direct current (DC) blocking, energy storage, power factor (PF) correction, and/or so forth.

Disclosed herein are combinations of MIM capacitors which can be fabricated as part of the BEOL processing. Some embodiments disclosed herein advantageously provide for fabrication of multiple capacitors in a limited area and in which the constituent capacitors can have large differences in capacitance values. This provides greater flexibility in the IC design as the designers are provided with access to easily fabricated BEOL MIM capacitors with widely different capacitance values.

Additionally, in some embodiments, the lower-valued capacitor can be compact in the out-of-wafer plane direction (e.g., parallel with the vias 18 in FIG. 1), which can beneficially allow routing of electrical conductors underneath the capacitor.

With continuing reference to FIG. 1, an illustrative MIM capacitor structure 20 according to an embodiment is shown in the context of the stack of patterned metallization layers 14, and also in an enlarged sectional view. The illustrative MIM capacitor structure 20 includes a three-dimensional metal-insulator-metal (3D-MIM) capacitor 22 and a shallow 3D-MIM capacitor 24. The 3D-MIM capacitor 22 includes at least one deep trench capacitor 30 (which in the illustrative embodiment comprises three deep trench capacitors 30) that pass through the dielectric material 16 and contact a patterned metallization layer 14 that was previously formed in the BEOL processing (that is, the metallization layer 14 was formed previously to the formation of the MIM capacitor structure 20). The deep trench capacitor(s) 30 are deep in that the deep trench capacitor(s) 30 pass from a starting surface 32 of the dielectric material 16 on (and in) which the MIM capacitor structure 20 was formed, and through the dielectric material 16 to land on an underlying patterned metallization layer 14. The illustrative shallow 3D-MIM capacitor 24 includes one deep trench capacitor 30 as well as at least one shallow trench capacitor 34 (illustrative two shallow trench capacitors 34). The shallow trench capacitor (s) 34 are shallow in that they do not penetrate to the underlying patterned metallization layer 14. In the illustrative example of FIG. 1, the two shallow trench capacitors 34 land on (i.e. contact) an embedded metal region 36 that is embedded in the dielectric material 16 between the surface 32 and the underlying patterned metallization layer 14. The embedded metal region 36 may, by way of nonlimiting illustrative example, comprise an electrically conductive material such as copper, aluminum, a copper alloy, or an aluminum alloy.

The trench capacitors 30 and 34 are formed from a MIM multilayer that is deposited on the dielectric material 16 (i.e., on the surface 32) and inside one or more deep trenches formed in the dielectric material (these portions ultimately form the trench capacitors 30 and 34). The MIM multilayer includes a first conductive layer 40, a second conductive layer 42, and a dielectric layer 44 interposed between the first conductive layer and the second conductive layer. In some nonlimiting illustrative embodiments, the first conductive layer 40 of the MIM multilayer may comprise a tantalum (Ta) layer, a tantalum nitride (TaN) layer, a titanium nitride (TiN) layer, a copper (Cu) layer, an aluminum (Al) layer, or a multilayer of two or more of a Ta layer, a TaN layer, a TiN layer, a Cu layer, and/or an Al layer. The first conductive layer 40 may in some notations be referred to as a capacitor bottom metal (CBM) or the like, insofar as it is typically electrically contacted by a lower conductor (e.g., the patterned metallization layer 14 or embedded metal region 36 that is below the trench capacitor 30 or 34). Note that in this context, the metal of the CBM may be a suitably electrically conductive material that is not an elemental metal or metal alloy, such as TaN or TiN. In some nonlimiting illustrative embodiments, the second conductive layer 42 of the MIM multilayer may comprise a Ta layer, a TaN layer, a TiN layer, a Cu layer, an Al layer, or a multilayer of two or more of a Ta layer, a TaN layer, a TiN layer, a Cu layer, and/or an Al layer. The second conductive layer 42 may in some notations be referred to as a capacitor top metal (CTM) or the like, insofar as it is electrically contacted by an upper conductor. In some nonlimiting illustrative embodiments, the dielectric layer 44 may include at least one high-k dielectric layer having a dielectric constant that is greater than the dielectric constant of silicon dioxide ($SiO_2$). As some examples, the at least one high-k dielectric layer of the dielectric layer 44 may include one or more of hafnium silicate, zirconium silicate, hafnium dioxide, zirconium dioxide, or multilayers thereof, as some nonlimiting illustrative examples.

As further seen in FIG. 1, each of the 3D-MIM capacitors 22 and 24 include a cap structure disposed over the trenches 30 and/or 34. The illustrative cap structure includes a dielectric spacer 49 (which in the illustrative examples is the same material as the IMD material 16, e.g. $SiO_2$ or another oxide in some examples), a bilayer of silicon oxynitride (SiON) 50 and silicon nitride (SiN) 52, and sidewall structures 54, and further embedding a dielectric material 56 (which in the illustrative examples is the same material as the IMD material 16, e.g. $SiO_2$ or another oxide in some examples). Each 3D-MIM capacitor 22 and 24 is electrically contacted by a top via 58 passing through the cap structure. The top via 58 may, by way of nonlimiting illustrative example, comprise an electrically conductive material such as copper, aluminum, a copper alloy, or an aluminum alloy. The top via 58 electrically contacts the second conductive layer 42 of the MIM multilayer; while, the underlying patterned metallization layer 14 contacts the first conductive layer 40 of the MIM multilayer where the deep trenches 30 land on the underlying patterned metallization layer 14.

In general, the capacitance C of the 3D-MIM capacitor 22 or 24 is given by:

$$C = \frac{\varepsilon A}{d}$$

where d is the thickness of the dielectric layer 44 of the MIM multilayer, ε is the dielectric constant of the dielectric layer 44 of the MIM multilayer, and A is the total area of the (portion of) the MIM multilayer included in the capacitor. The 3D-MIM capacitor 22 and the 3D-MIM capacitor 24 differ in terms of the area A, with the 3D-MIM capacitor 22 having a substantially larger area due to the total area of the MIM multilayer of its three deep trench capacitors 30, compared with the lesser area of the single deep trench 30 and two shallow trenches 34 of the 3D-MIM capacitor 24.

In FIG. 1, the illustrative MIM capacitor structure 20 is shown at the top of the metallization stack, i.e. with the top vias 58 accessible at the surface. However, the MIM capacitor structure could be located elsewhere within the stack of patterned metallization layers 14 embedded in the IMD material 16. FIG. 1, bottom drawing illustrates this by way of showing another illustrative MIM capacitor structure 120 that is located further down in the metallization stack.

With reference now to FIGS. 2A-2H, a MIM capacitor manufacturing workflow according to an embodiment is illustrated by way of a sequence of sectional views at various stages of the fabrication. FIGS. 2A-2H illustrate fabrication of the shallow trench 3D-MIM capacitor 24 of FIG. 1. Fabrication of the deep trench 3D-MIM capacitor 22 is suitably performed simultaneously, with the deep trench capacitors 30 of the deep trench 3D-MIM capacitor 22 being formed at the same time and by the same processing as the single deep trench capacitor 30 of the shallow trench 3D-MIM capacitor 22.

Figure 2A:
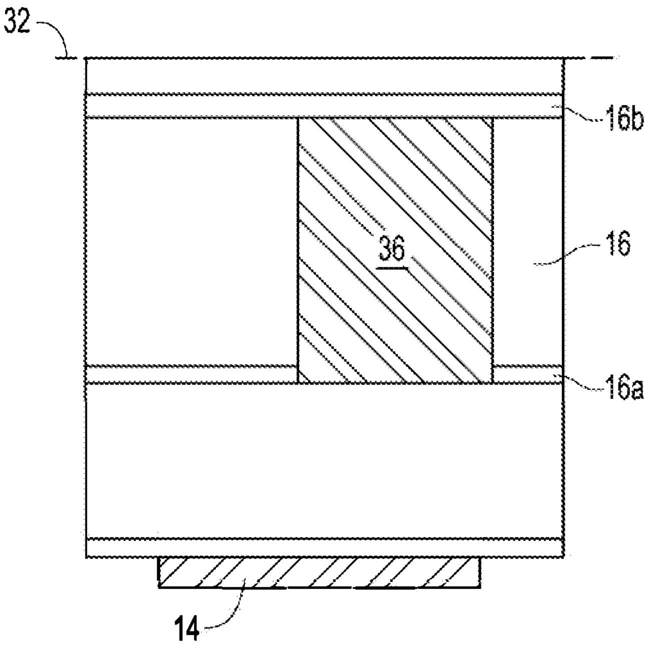
FIGS. 2A, 2B, 2C, 2D, 2E, 2F, 2G, and 2H diagrammatically illustrate a MIM capacitor manufacturing workflow according to an embodiment.

Starting with FIG. 2A, an initial film stack is formed on the patterned metallization layer 14. The film stack includes the dielectric material 16 and the embedded metal region 36. The initial film stack is suitably formed by typical BEOL processing such as depositing the dielectric material 16 as $SiO_2$ formed by PEALD, CVD, or another deposition technique, and suitable photolithographic patterning and metal deposition to form the embedded metal region 36. The deposition of the dielectric material 16 is up to the starting surface 32, which then serves as the starting surface on and in which the 3D-MIM capacitor is formed.

While the bulk of the dielectric material 16 comprises $SiO_2$ or another chosen base dielectric material, the dielectric material 16 may optionally also include one or more interleaved layers of different types of dielectric material, such as an illustrative silicon nitride (SiN) layer 16*a* and an illustrative silicon carbide (SiC) layer 16*b* interleaved in the bulk $SiO_2$ material 16. These interleaved dielectric layers 16*a*, 16*b* of different dielectric materials may be used for various other process steps of the BEOL processing for fabricating various features unrelated to the 3D-MIM capacitor manufacturing sequence, such as serving as etch stops for certain etch steps. As an example, in one suitable workflow the dielectric material 16 is etched to form an opening that is then filled to form the embedded metal region 36, and in this etch process the SiN layer 16*a* could serve as an etch stop. For simplicity of illustration, the interleaved dielectric layers 16*a*, 16*b* are labeled with reference numbers only in FIG. 2A.

Figure 2B:
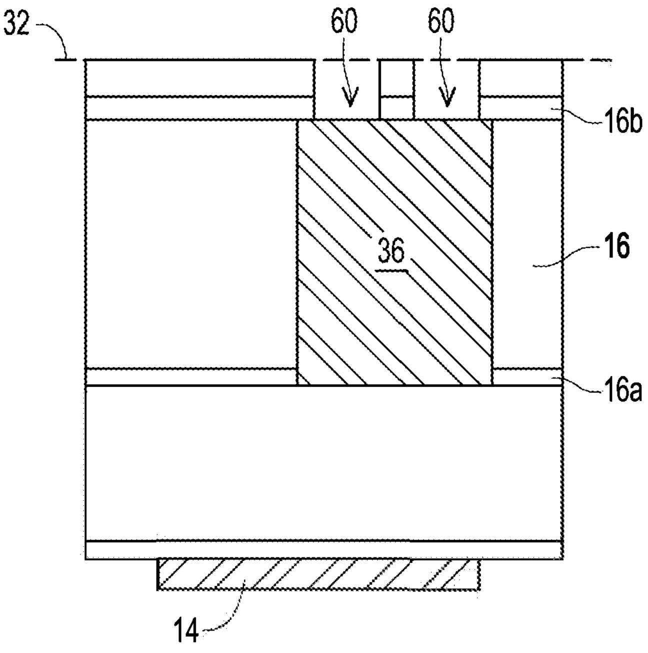

With reference to FIG. 2B, shallow trenches 60 are formed, which will be subsequently filled in to form the shallow trench capacitors 34. This step suitably employs photolithographically defined etching using the embedded metal region 36 as an etch stop. The depth of these shallow trenches 60 is thus controlled by the fraction of the dielectric material 16 disposed over the embedded metal region 36. In other words, the depth of the shallow trenches 60 is the difference in height between the starting surface 32 and the top of the embedded metal region 36.

Figure 2C:
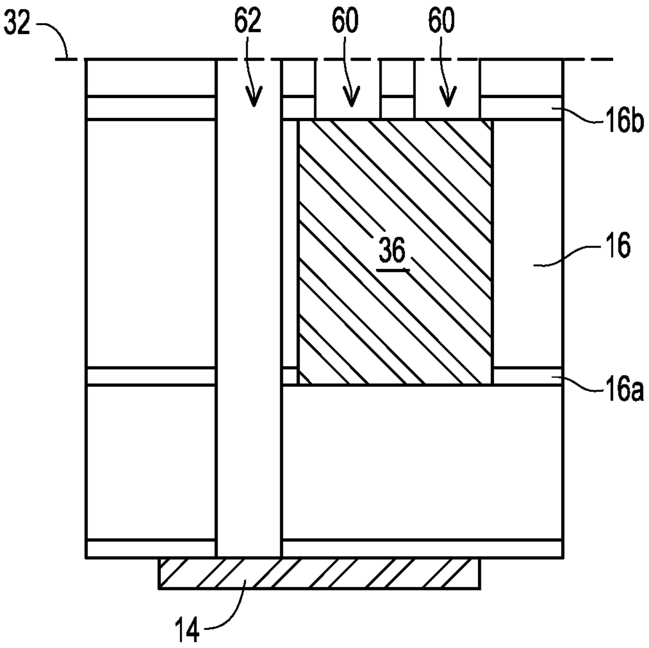

With reference to FIG. 2C, a deep trench 62 is formed, which will be subsequently filled in to form the (illustrative single) deep trench capacitor 30 of the shallow 3D-MIM capacitor 24. This step suitably employs photolithographically defined etching using the underlying patterned metallization layer 14 as an etch stop. The depth of the deep trench 62 is thus the difference in height between the starting surface 32 and the patterned metallization layer 14. Although not shown, additional deep trenches analogous to the illustrated deep trench 62 are formed which will be subsequently filled in to form the deep trench capacitors 30 of the deep trench 3D-MIM capacitor 22.

Figure 2D:
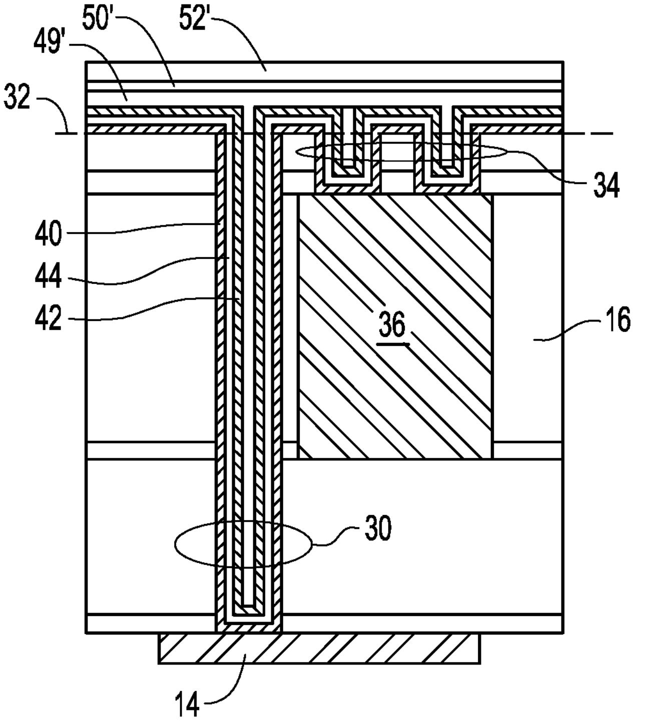

With reference to FIG. 2D, the MIM multilayer 40, 42, 44 is deposited on the dielectric material 16 (and, more particularly, on the starting surface 32 of the dielectric material 16) and inside the one or more deep trenches 62 formed in the dielectric material 16 and inside the one or more shallow trenches 60 formed in the dielectric material 16. The deposited MIM multilayer includes, in order of deposition: the first conductive layer 40 (i.e., the capacitor bottom metal or CBM); the dielectric layer 44; and the second conductive layer 42 (i.e., the capacitor top metal or CTM). Hence, the dielectric layer 44 is interposed between the first conductive layer (CBM) 40 and the second conductive layer (CTM) 42. The deposition of the MIM multilayer 40, 42, 44 can employ any suitable deposition technique, such as CVD, plasma-enhanced CVD, or so forth. After deposition of the MIM multilayer 40, 42, 44, a portion of the cap structure is formed, including deposition of a spacer layer 49', a SiON layer 50' and a SiN layer 52'. Notably, the deposition of the spacer layer 49' also fills in the remainder of the volume inside the trenches 60 and 62 that is not filled with the MIM multilayer 40, 42, 44. A planarization step may optionally be performed after deposition of the spacer layer 49' to provide a planar surface for the subsequent deposition of the SiON layer 50' and SiN layer 52'. This results in the structure shown in FIG. 2D.

Figure 2E:
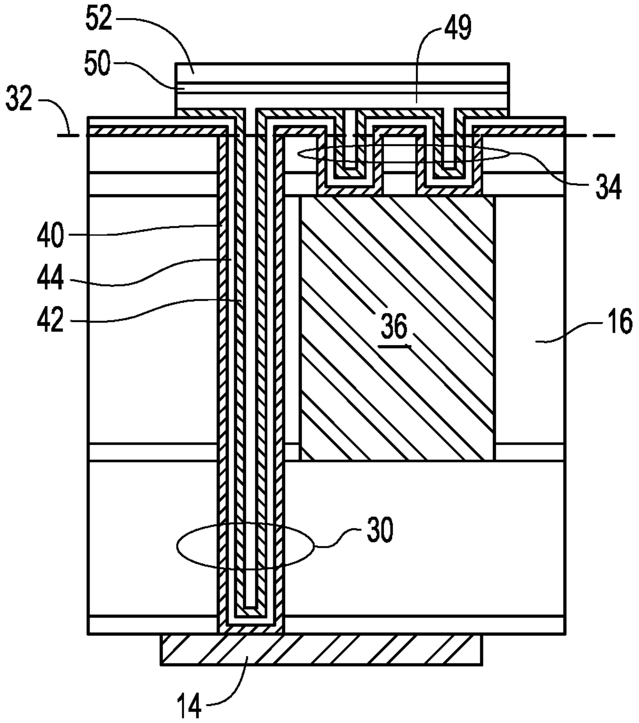

With reference to FIG. 2E, to spatially delineate the cap structure, the outer portions of the spacer layer 49', SiON layer 50', and SiN layer 52' are etched, along with the CTM layer 44 of the MIM multilayer. The etching of the spacer layer 49' delineates the dielectric spacer 49. The etching of the SiON layer 50' delineates the SiON layer 50. The etching of the SiN layer 52' delineates the SiN layer 52. Photolithography can be employed during the etching. This results in the structure shown in FIG. 2E.

Figure 2F:
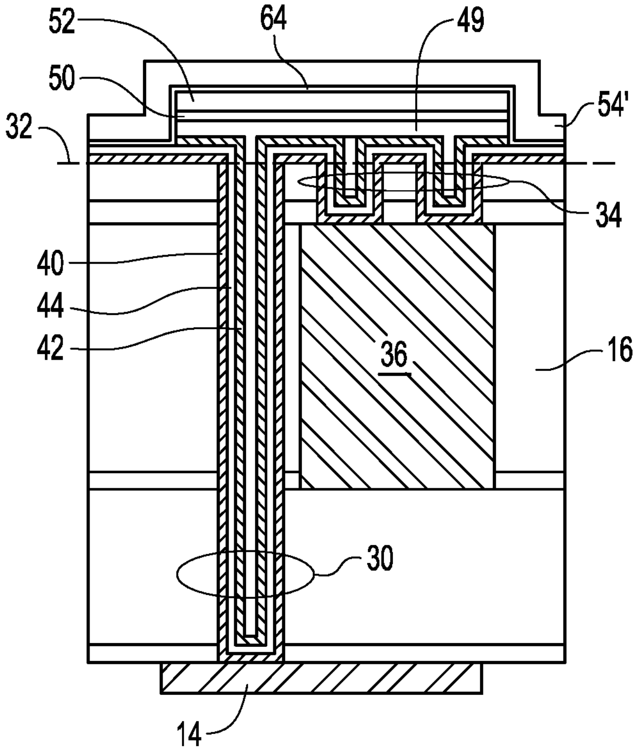

With reference to FIG. 2F, a further dielectric layer 64 of the same material as the dielectric material 16 (i.e., $SiO_2$ in the illustrative examples) is deposited over the bilayer 50, 52 and over the periphery of the under-formation cap structure, and a further SiN layer 54' is deposited on the dielectric layer 64. This results in the structure shown in FIG. 2F.

Figure 2G:
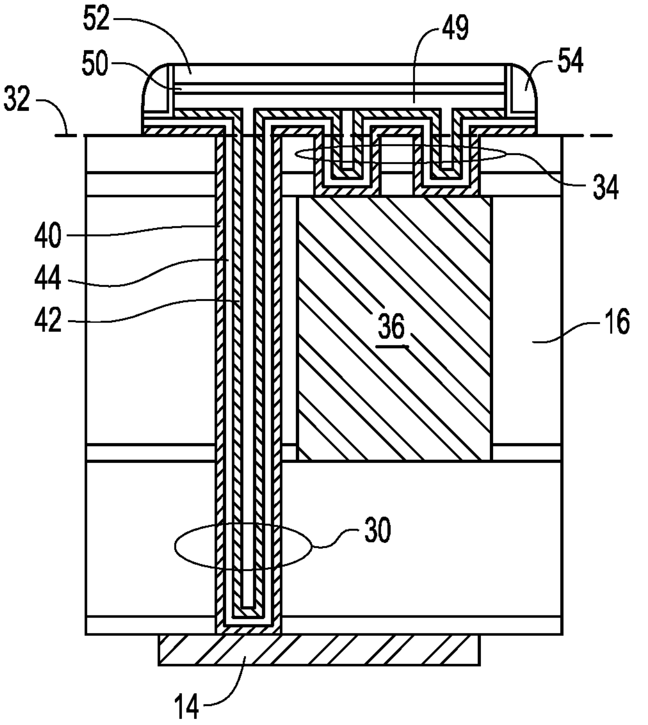

With reference to FIG. 2G, a self-aligned blanket etch is performed. This etch has an etch rate/time designed to etch away the portions of the $SiO_2$ layer 64 and SiN layer 54' disposed on the bilayer 50, 52 and the outer peripheral portions of these layers. The remainder of the MIM multilayer stack is also etched away in this step, thus electrically isolating the portion of the MIM multilayer 40, 42, 44 of the shallow 3D-MIM capacitor 24 from the portion of the MIM multilayer 40, 42, 44 of the deep 3D-MIM capacitor 22. However, portions of the $SiO_2$ layer 64 and SiN layer 54' adjacent the bilayer 50, 52 remain, forming the sidewall structures 54 spaced apart by the remaining portion of the $SiO_2$ layer 64. The sidewall structures 54 are thus formed by a self-aligned etching process. This results in the structure shown in FIG. 2G. The sidewall structures 54 provide further electrical isolation between the two 3D-MIM capacitors 22 and 24, and can facilitate close packing of 3D-MIM capacitors.

Figure 2H:
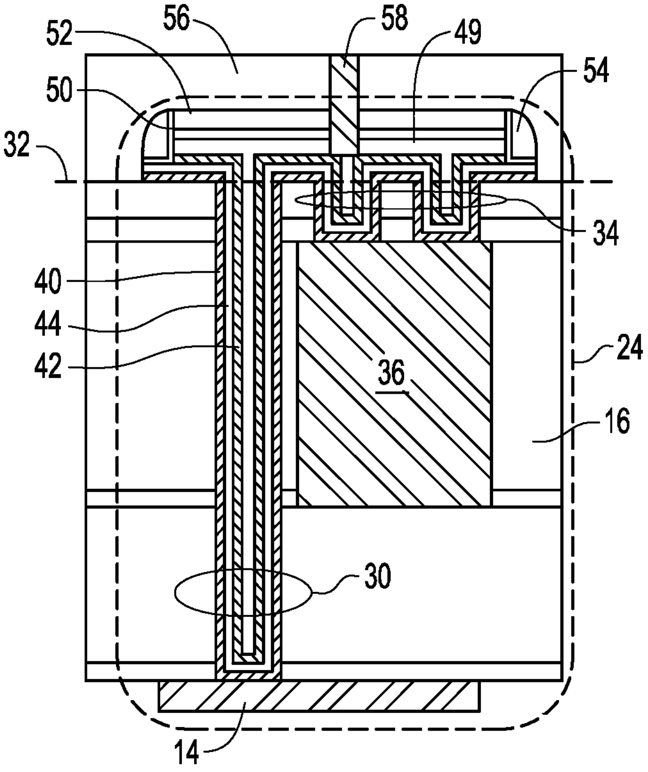

With reference to FIG. 2H, BEOL processing continues by depositing further dielectric material 56 on the cap structure. A top via opening is then formed and filled in with electrically conductive material to from the top via 58. This results in the final structure shown in FIG. 2H, which corresponds to the shallow trench 3D-MIM capacitor 24 of FIG. 1.

The shallow 3D-MIM capacitor 24 of FIGS. 1 and 2H includes the single deep trench capacitor 30, which provides electrical connection to the underlying patterned metallization layer 14. This enables the patterned metallization layer 14 to provide electrical contact to the first conductive layer 40 (i.e., the CBM 40) of the MIM multilayer, thus enabling coupling of the shallow 3D-MIM capacitor 24 into the overall circuitry of the integrated circuit (IC). The total capacitance of the shallow 3D-MIM capacitor 24 of FIGS. 1 and 2H thus includes the capacitance of the single deep trench capacitor 30 along with the capacitances of the shallow trench capacitors 34.

Figure 3:
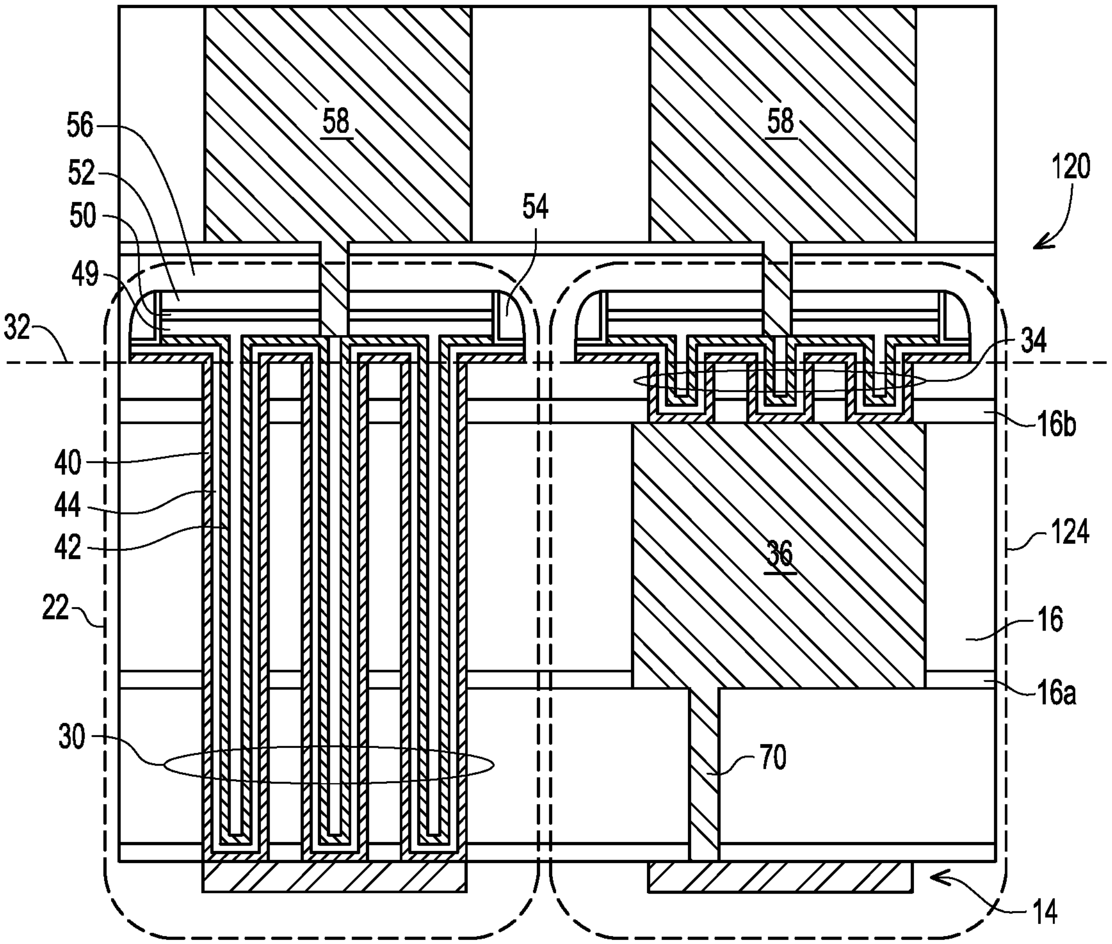
FIG. 3 diagrammatically illustrates a sectional view of two MIM capacitors according to an embodiment.

With reference now to FIG. 3, a MIM capacitor structure 120 is shown which is similar to the MIM capacitor structure 20 of FIG. 1, and includes the deep trench 3D-MIM capacitor 22 as in the embodiment of FIG. 1. However, the MIM capacitor structure 120 of FIG. 3 includes a variant embodiment of a shallow trench 3D-MIM capacitor 124 in which the single deep trench 30 of the shallow trench 3D-MIM capacitor 24 of the MIM capacitor structure 20 of FIG. 1 is replaced by a third shallow trench capacitor 34. Hence, the variant 3D-MIM 124 has three shallow trench capacitors 34 and zero deep trench capacitors; whereas, the 3D-MIM 24 of FIG. 1 has two shallow trench capacitors 34 and one deep trench capacitor 30. To provide electrical connection to the first conductive layer 40 (i.e., to the CBM 40) in the MIM capacitor structure 120 of FIG. 3, a via 70 electrically connects the embedded metal region 36 to the patterned metallization layer 14.

Fabrication of the variant MIM capacitor structure 120 of FIG. 3 is substantially similar to the fabrication sequence for the MIM capacitor structure 20 described previously with reference to FIGS. 2A-2H, except that in forming the initial film stack the via 70 is formed. This can be done by depositing the dielectric material 16 up to the SiN layer **16*a* (in the nonlimiting illustrative example of FIG. 3), followed by photolithographically controlled etching of a via opening that is filled with an electrically conductive material such as copper, aluminum, a copper alloy, or an aluminum alloy to form the via 70. Thereafter, deposition of the dielectric material 16 continues up to the starting surface 32, and fabrication thereafter follows as for the embodiment of FIG. 1 except that in the processing depicted in FIG. 2B three shallow trenches 60 are formed (instead of two as shown in FIG. 2C) and the deep trench 62 is not formed for the 3D-MIM capacitor 124 (though the deep trenches are formed for the deep 3D-MIM capacitor 20 that is fabricated together with the shallow 3D-MIM capacitor 124**).

In the MIM capacitor structures 20 and 120 of respective FIGS. 1 and 3, the shallow trenches 34 are formed using the embedded metal region 36 as an etch stop or landing for the etching of the shallow trenches 60 (see FIG. 2C). As a consequence, the shallow trenches 34 have the same depth, and hence have the same capacitance.

Figure 4:
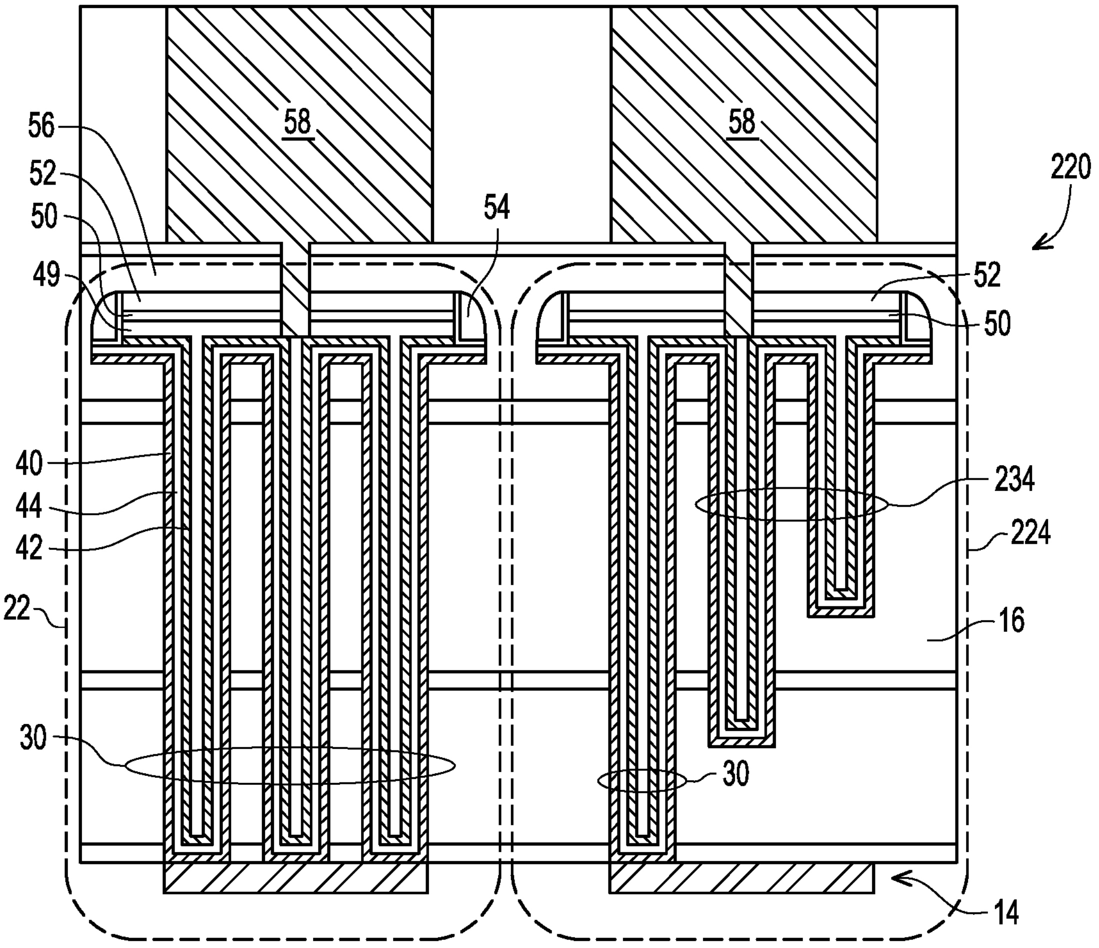
FIG. 4 diagrammatically illustrates diagrammatically illustrates a sectional view of two MIM capacitors according to an embodiment.

With reference now to FIGS. 4, an MIM capacitor structures 220 is shown, which again includes the deep 3D-MIM capacitor 22 which is not described again for brevity. In the MIM capacitor structures 220 of FIG. 4, the second capacitor is a variable shallow trench MIM capacitor 224 which as one deep trench 30 landing on the underlying patterned metallization layer 14 (thereby providing electrical contact between the CBM 40 and the patterned metallization layer 14) and two shallow trench capacitors 234 of different depths. Unlike the embodiment of FIGS. 1 and 3, these shallow trench capacitors 234 do not land on an embedded metal region, as the embedded metal region 36 of the embodiments of FIGS. 1 and 3 is omitted in the variable shallow trench MIM capacitor 224 of FIG. 4. While two shallow trench capacitors 234 of different depths are shown in FIG. 4, more generally there may be one, two, three, or more shallow trench capacitors which may in general have different depths. The variable depths of the shallow trench capacitors 234 provide further flexibility in designing the capacitance of the variable shallow trench MIM capacitor 224.

Figure 5:
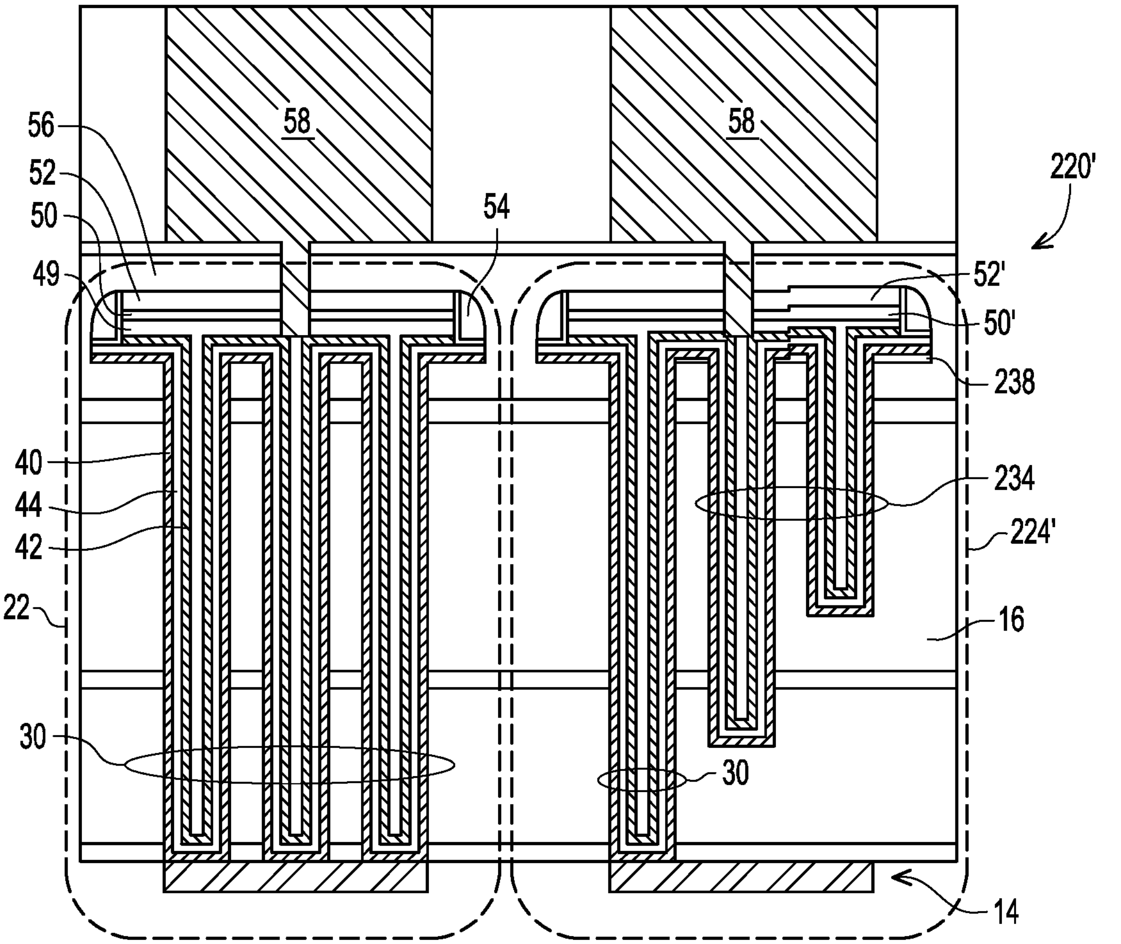
FIG. 5 diagrammatically illustrates diagrammatically illustrates a sectional view of two MIM capacitors according to an embodiment.

With reference to FIG. 5, a variant MIM capacitor structures 220' is shown, which includes the deep 3D-MIM capacitor 22 and a variant variable shallow trench MIM capacitor 224' which also includes the two shallow trench capacitors 234 of different depths. The variant variable shallow trench MIM capacitor 224' differs from the variable shallow trench MIM capacitor 224 in the cap structure. The cap structure of the variable shallow trench MIM capacitor 224 of FIG. 4 is the same as the corresponding cap structure of the shallow trench MIM capacitor 24 of FIG. 1 and the corresponding cap structure of the shallow trench MIM capacitor 124 of FIG. 3. Notably, the SiON layer 50 and the SiN 52 of the cap structure are flat planar layers in the embodiments of FIGS. 1, 3, and 4. By contrast, the corresponding SiON layer 50' and the SiN 52' of the cap structure of the variant variable shallow trench MIM capacitor 224' of FIG. 5 has steps. These steps correspond to a stepped structure of a blocking layer 238. As will be described in more detail in the following, the fabrication process for both the variable shallow trench MIM capacitor 224 of FIG. 4 and the variant variable shallow trench MIM capacitor 224' of FIG. 5 include formation of the blocking layer 238. However, in the fabrication of the variable shallow trench MIM capacitor 224 of FIG. 4, the blocking layer 238 is removed prior to formation of the cap structure; whereas, in the fabrication of the variant variable shallow trench MIM capacitor 224' of FIG. 5 the blocking layer 238 is not removed prior to formation of the cap structure.

Figure 6A:
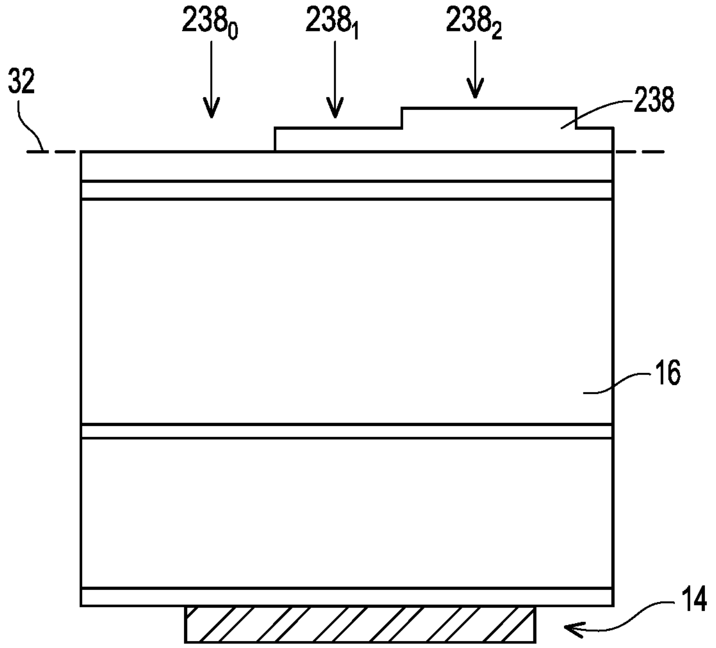
FIGS. 6A, 6B, 6C, and 6D diagrammatically illustrate a MIM capacitor manufacturing workflow according to certain embodiments.

With reference now to FIGS. 6A-6D, a MIM capacitor manufacturing workflow according to an embodiment is illustrated by way of a sequence of sectional views at various stages of the fabrication. FIGS. 6A-6D illustrate steps in the fabrication of the deep trench capacitor 30 and the two shallow trench capacitors 234 of the variable shallow trench 3D-MIM capacitor 224 or 224' of FIG. 1. Starting with FIG. 6A, the dielectric material 16, such as $SiO_2$ in one nonlimiting illustrative embodiment, is deposited on the patterned metallization layers 14 up to the starting surface 32 by PEALD, CVD, or another deposition technique. Additionally, the blocking layer 238 is deposited on the dielectric material 16. As shown in FIG. 6A, the blocking layer 238 has a nonuniform thickness, and includes a portion $\mathbf{238_0}$ on which no blocking layer is deposited, a thinner blocking layer portion $\mathbf{238_1}$ and a thicker blocking layer portion $\mathbf{238_2}$. The blocking layer 238 should be a material that is more resistant to the etchant used in the subsequent trench etching than the dielectric material 16. In one nonlimiting illustrative example, the dielectric material 16 is $SiO_2$ and the blocking layer 238 is silicon nitride (SiN). To obtain the nonuniform thickness of the blocking layer 238, multiple photolithographically delineated deposition steps can be performed. For example, a first photolithography mask provides an opening corresponding to the total area of the blocking layer 238, followed by deposition up to the thickness of the thinner blocking layer portion $\mathbf{238_1}$. Then, a second photolithography mask provides a reduced opening corresponding to the area of the thicker blocking layer portion $\mathbf{238_2}$, followed by further deposition of the material of the blocking layer up to the thickness of the thicker blocking layer portion $\mathbf{238_2}$.

Figure 6B:
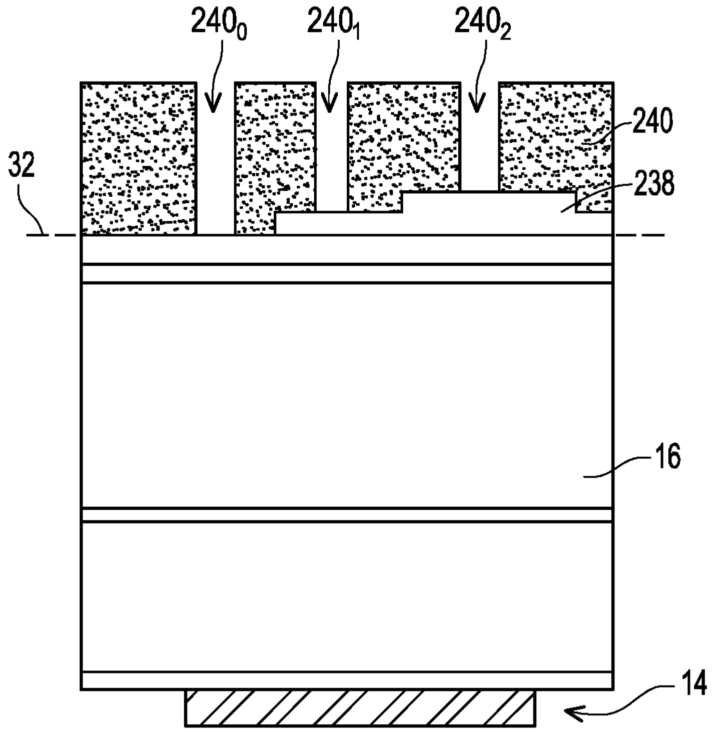

With reference to FIG. 6B, a photoresist 240 is deposited, and photolithographically delineated openings $\mathbf{240_0}$, $\mathbf{240_1}$, and $\mathbf{240_2}$ are opened in the photoresist 240. The opening $\mathbf{240_0}$ is in an area not coated with the blocking layer 238. The opening $\mathbf{240_1}$ is in an area coated with the thinner blocking layer portion $\mathbf{238_1}$. The opening $\mathbf{240_2}$ is in an area coated with the thicker blocking layer portion $\mathbf{238_2}$. The opening $\mathbf{240_0}$ corresponds to the location where the deep trench capacitor 30 will be formed. The openings $\mathbf{240_1}$ and $\mathbf{240_2}$ correspond to the locations where the two shallow trench capacitors 234 will be formed.

Figure 6C:
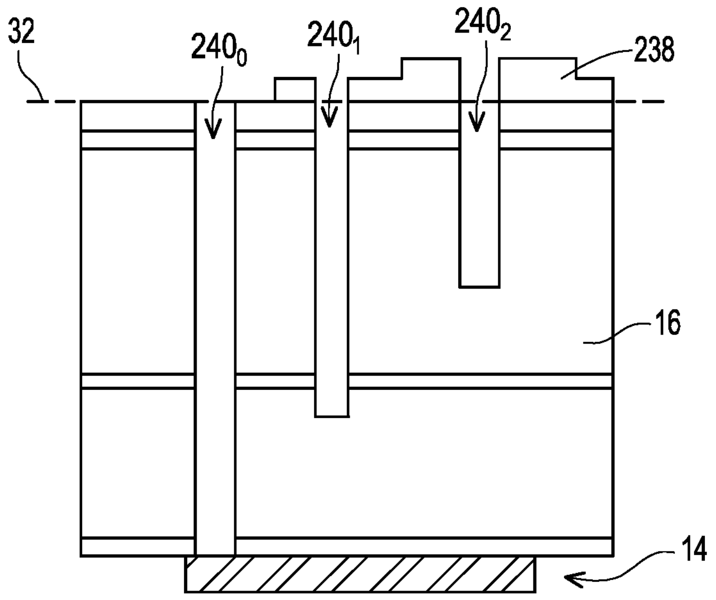

With reference to FIG. 6C, trenches $\mathbf{242_0}$, $\mathbf{242_1}$, and $\mathbf{242_2}$ are etched through the corresponding photoresist openings $\mathbf{240_0}$, $\mathbf{240_1}$, and $\mathbf{240_2}$. This etch is a timed etch. The etch time is long enough so that the trench $242_0$ is formed through the dielectric layer 16 to access the underlying patterned metallization layer 14. However, due to the higher etch resistance of the SiN blocking layer 238, the trenches $242_1$ and $242_2$ are shallower, and do not reach the patterned metallization layer 14. Moreover, the depth of each of the trenches $242_1$ and $242_2$ is controlled by the local thickness of the blocking layer 238. Hence, the trench $242_1$ which is etched through the thinner blocking layer portion $238_1$ is deeper than the trench $242_2$ which is etched through the thicker blocking layer portion $238_2$. The suitable thickness for the blocking layer portions $238_1$ and $238_2$ and the etch time are suitably optimized by empirical test runs. Moreover, it will be appreciated that the number of trenches of different depths (all less than the depth of the deep trench $242_0$) can be as few as one, or can be two (as shown), three, four, or more, by way of forming the blocking layer 238 with suitable nonuniform thickness steps.

With reference to FIG. 6C and reference back to FIG. 5 and back to processing FIGS. 2D-2H, to manufacture the MIM capacitor structures 220' of FIG. 5, the processing of FIGS. 2D-2H previously described is suitably applied without removing the blocking layer 238 that remains after etching the trenches $242_0$, $242_1$, and $242_2$. Consequently, as seen in FIG. 5 the blocking layer 238 remains in place (except where it was etched away to form the trenches $242_0$, $242_1$, and $242_2$) which results in the cap structure having a nonuniform (e.g. stepped) planarity corresponding to the steps of the remaining portions of the thinner blocking layer portion $238_1$ and thicker blocking layer portion $238_2$.

Figure 6D:
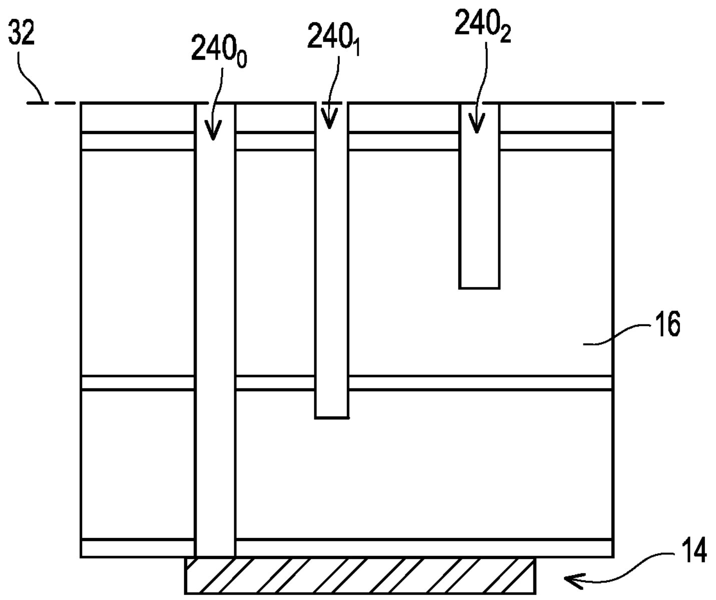

With reference to FIG. 6D and reference back to FIG. 4 and back to processing FIGS. 2D-2H, to manufacture the MIM capacitor structures 220 of FIG. 4, an intervening step of removing (the remaining portions of) the blocking layer 238 is performed to produce the structure shown in FIG. 6D, after which the processing of FIGS. 2D-2H previously described is applied to complete fabrication of the MIM capacitor structures 220 of FIG. 4. Due to removal of the remaining blocking layer 238, the cap structure has a uniform (e.g. flat) planarity.

In the embodiments described thus far, the second capacitor 24 (see FIG. 1) or 124 (see FIG. 3) or 224 (see FIG. 4) or 224' (see FIG. 5) is a shallow 3D-MIM capacitor having shallow trenches (and, in the cases of FIGS. 1, 4, and 5, one deep trench 30 landing on the underlying patterned metallization layer 14). In the next embodiments described, the second capacitor is a two-dimensional metal-insulator-metal (2D-MIM) capacitor comprising a portion of the MIM multilayer deposited on (the starting surface 32 of) the dielectric material 16, without any trenches.

Figure 7:
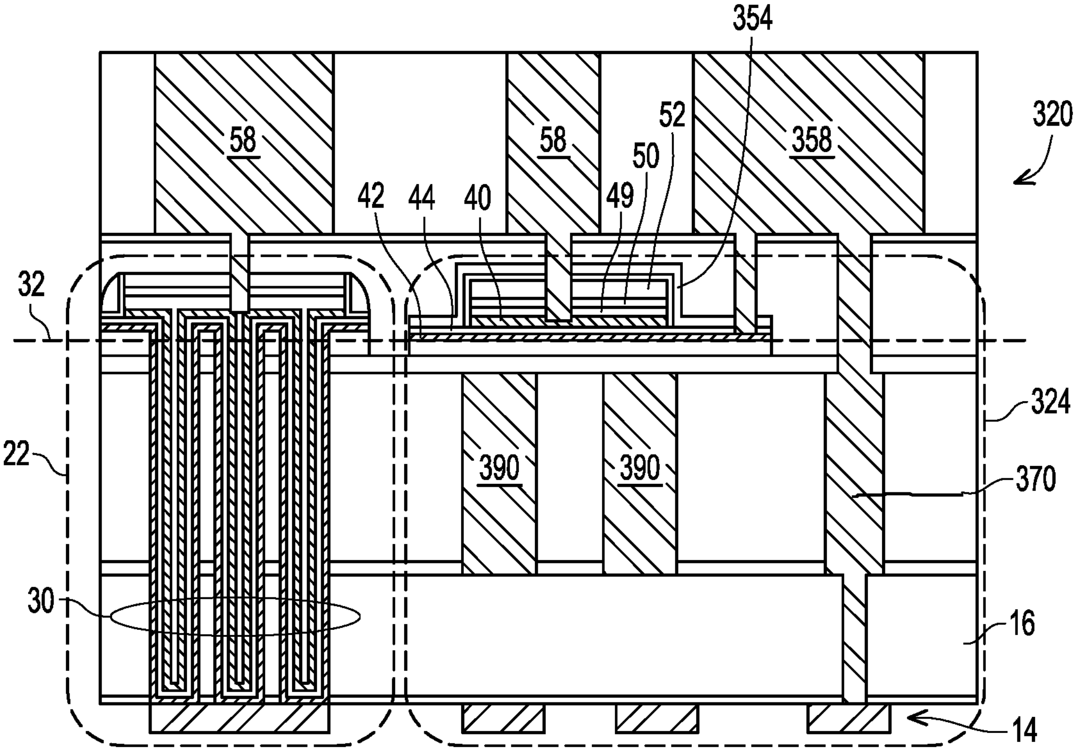
FIG. 7 diagrammatically illustrates a sectional view of two MIM capacitors according to an embodiment.
Figure 8:
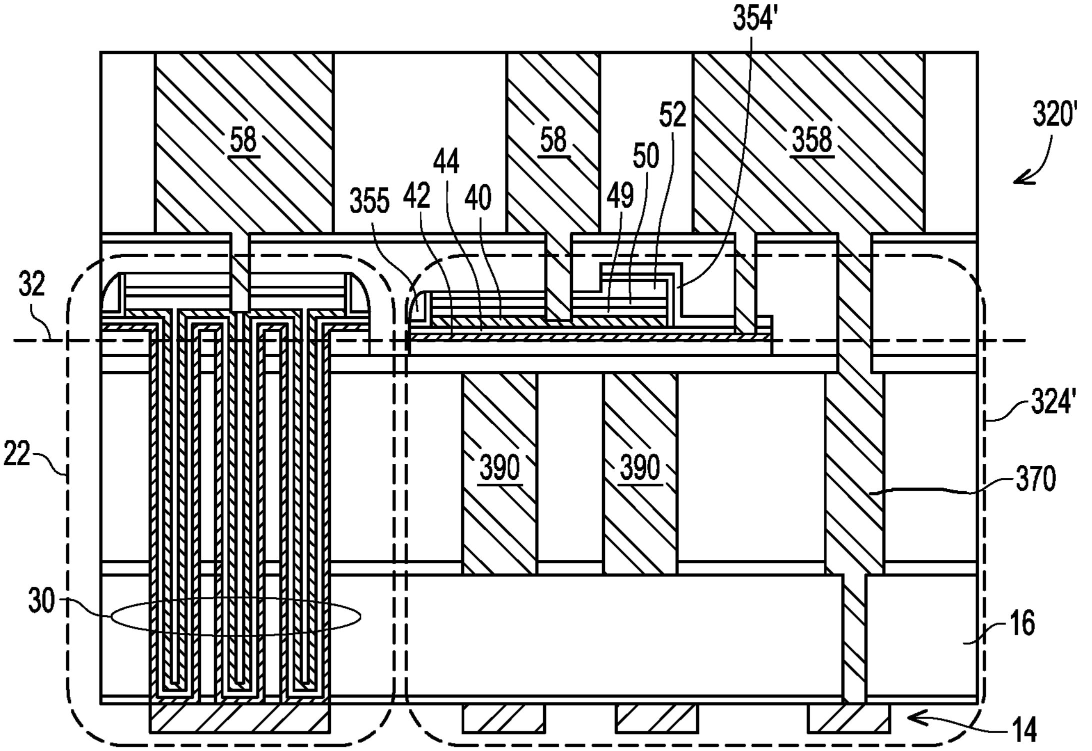
FIG. 8 diagrammatically illustrates a sectional view of two MIM capacitors according to an embodiment.

FIGS. 7 and 8 diagrammatically show two examples of illustrative MIM capacitor structures 320 and 320' which combine the deep 3D-MIM capacitor 22 with a 2D-MIM capacitor 324 (FIG. 7) or a 2D-MIM capacitor 324' (FIG. 8). As seen, these 2D-MIM capacitors 324 and 324' include the MIM multilayer 40, 42, 44 formed only on (the starting surface 32 of) the dielectric material 16, but not in any trenches. Hence, the 2D-MIM capacitors 324 and 324' are 2D insofar as they do not include any trenches. The illustrative 2D-MIM capacitors 324 and 324' include cap structures similar to previous embodiments, including the dielectric spacer 49 (e.g., $SiO_2$), the bilayer of SiON 50 and SiN 52, and a surrounding SiN structure 354 in the case of the 2D-MIM capacitor 324 or a partially surrounding SiN structure 354' in the case of the 2D-MIM capacitor 324', in each case embedded in further dielectric material 56 (e.g. $SiO_2$). Each 2D-MIM capacitor 324 or 324' has the CTM 42 electrically contacted by a top via 58, while a second via 358 connects the CBM 40 with the patterned metallization layer 14. The partially surrounding SiN structure 354' of the 2D-MIM capacitor 324' has an advantage in that it has a self-aligned sidewall structure 355 formed similarly to the sidewall structures 54 of prior embodiments. This avoids photoresist blocking when the CBM 40 is etched, which avoids the impact of CBM photolithographic processing variation and can enable closer cap-to-cap spacing between the 3D-MIM capacitor 22 and the 2D-MIM capacitor 324'.

Figure 9A:
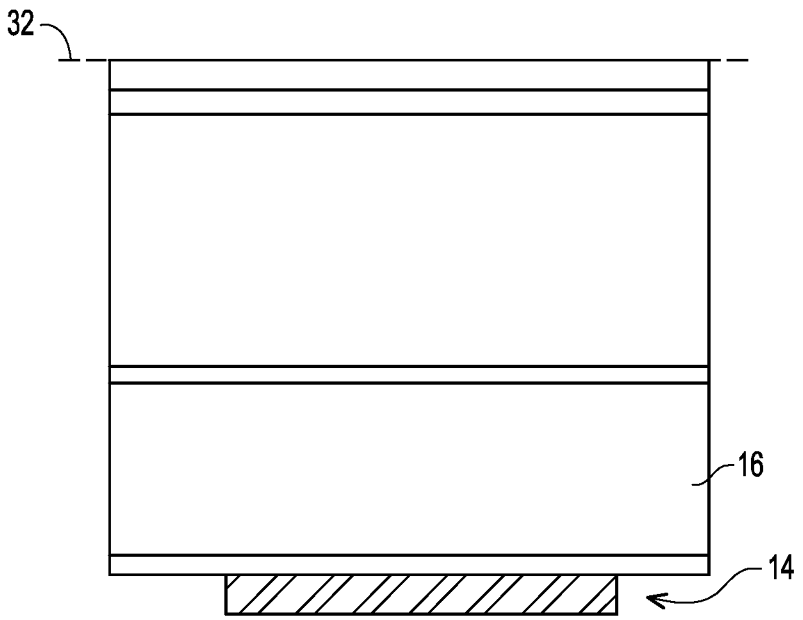
FIGS. 9A, 9B, 9C, 9D, 10A, 10B, 11A, and 11B diagrammatically illustrate a MIM capacitor manufacturing workflow according to certain embodiments.
Figure 9B:
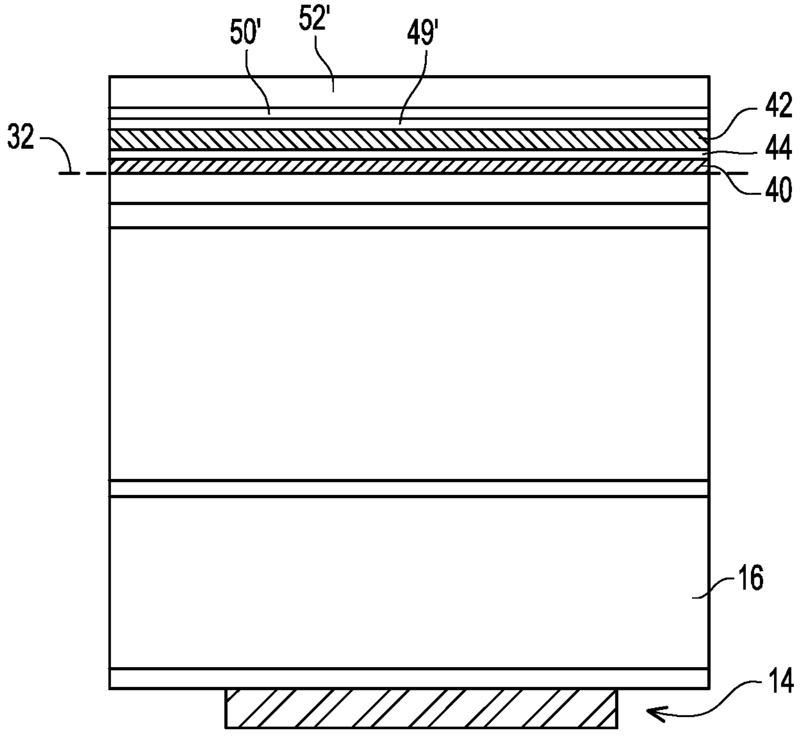
Figure 9C:
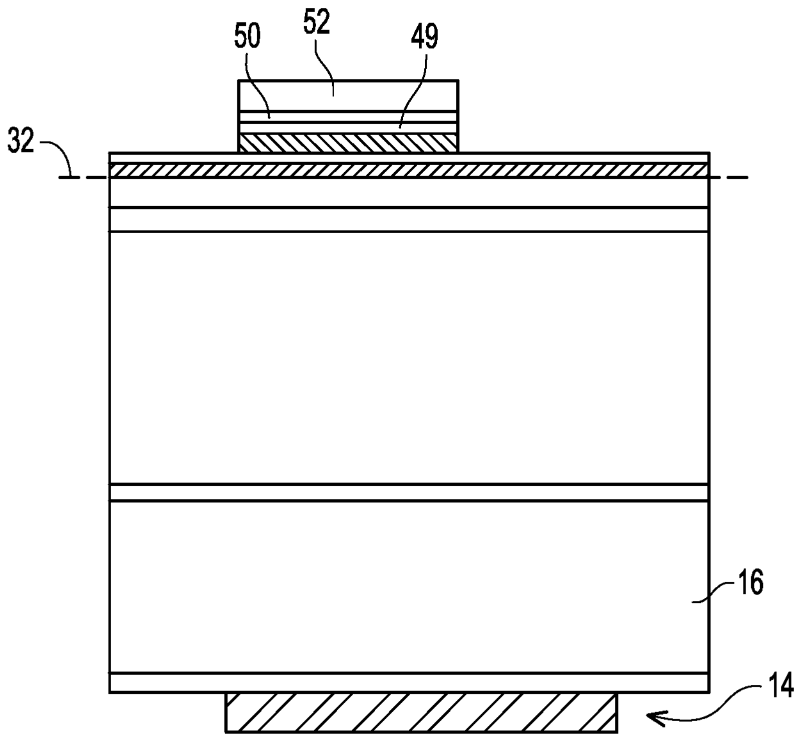
Figure 9D:
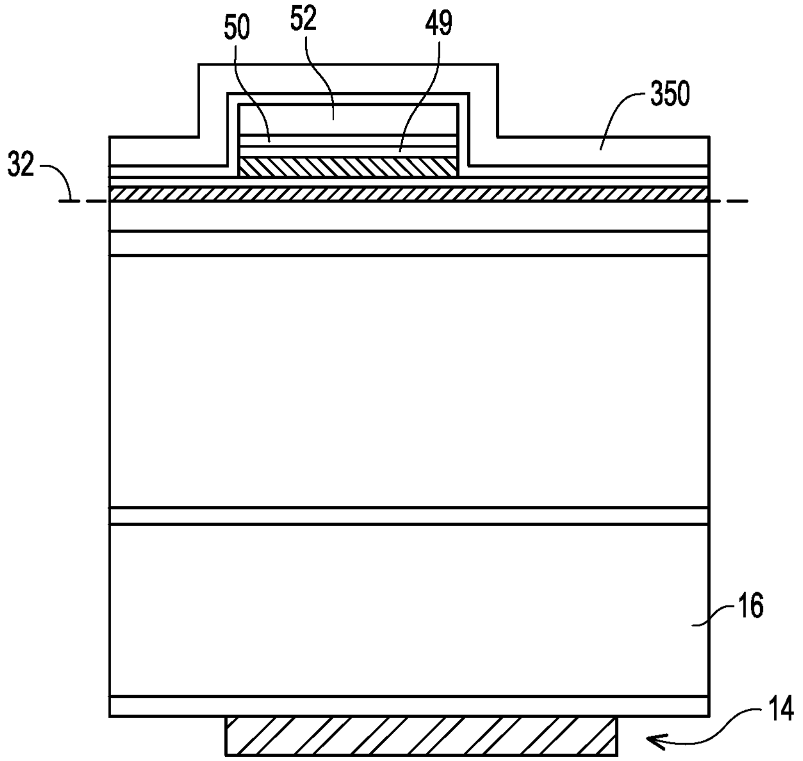

With reference to FIGS. 9A-9D, processing for fabricating the 2D-MIM capacitor 324 or 324' that is common to both capacitor designs 324 or 324' is shown by way of successive cross-sectional diagrams. FIG. 9A shows the deposition of the dielectric material on the patterned metallization layer 14 up to the starting surface 32. FIG. 9B shows deposition of the MIM multilayer 40, 42, 44 on the starting surface 32, followed by deposition of a blanket $SiO_2$ layer 49', SiON layer 50', and SiN layer 52'. FIG. 9C shows the structure after photolithographic etching to define the corresponding $SiO_2$ layer 49, SiON layer 50, and SiN layer 52 of the cap structure. FIG. 9D shows the structure after subsequent deposition of the surrounding SiN 350 (after deposition of spacer $SiO_2$) from which the surrounding SiN structure 354 of the embodiment of FIG. 7, or the surrounding SiN structure 354' and self-aligned sidewall structure 355 of the embodiment of FIG. 8, will be formed.

Figure 10A:
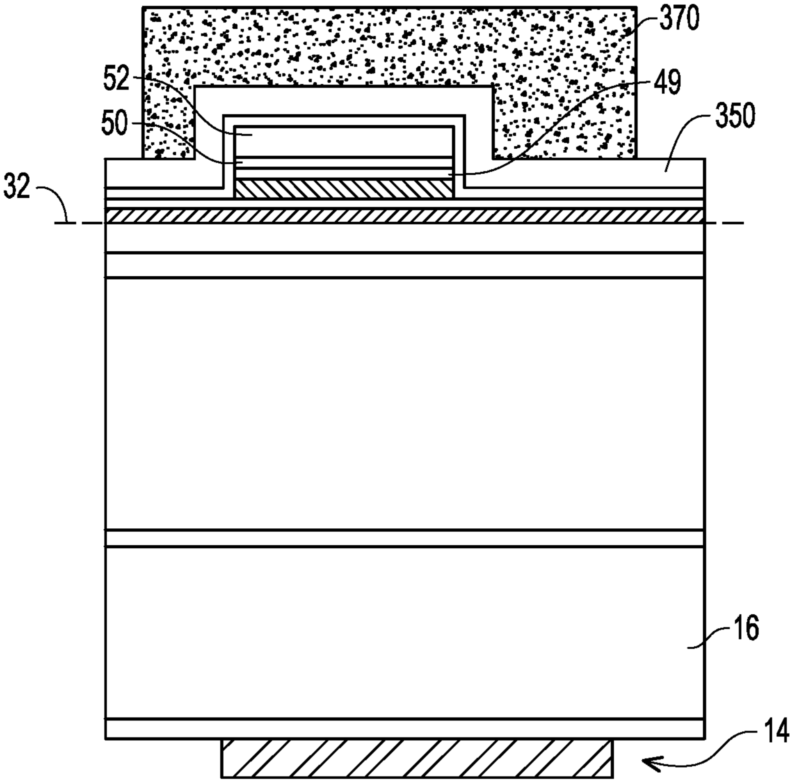
Figure 10B:
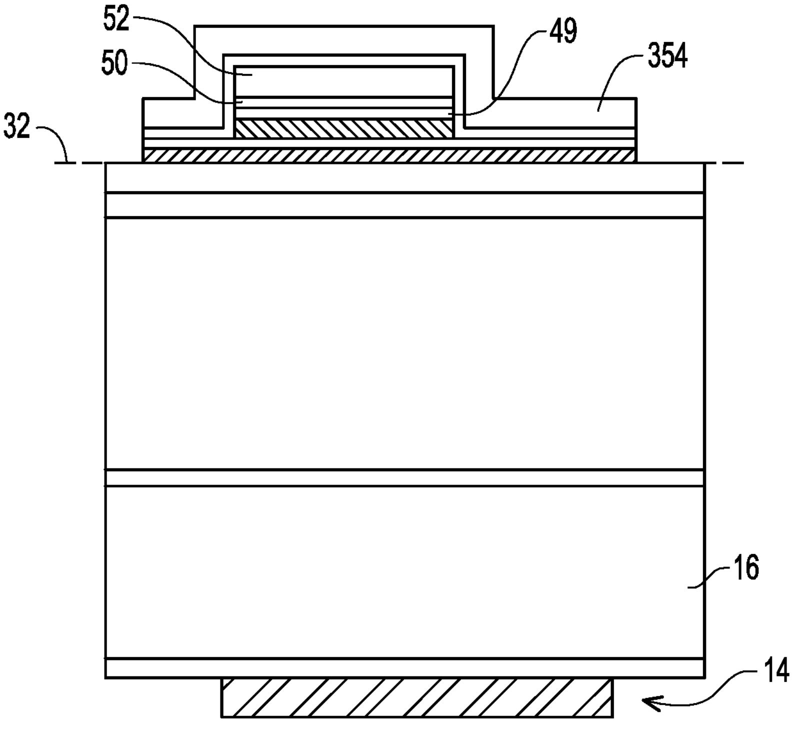

With reference to FIGS. 10A and 10B, further processing for the embodiment of FIG. 7 is shown. FIG. 10A shows the structure after deposition and patterning of photoresist 370 for protecting the cap structure. FIG. 10B shows the structure after etching and subsequent removal of the photoresist, leaving the surrounding SiN structure 354 of the cap structure.

Figure 11A:
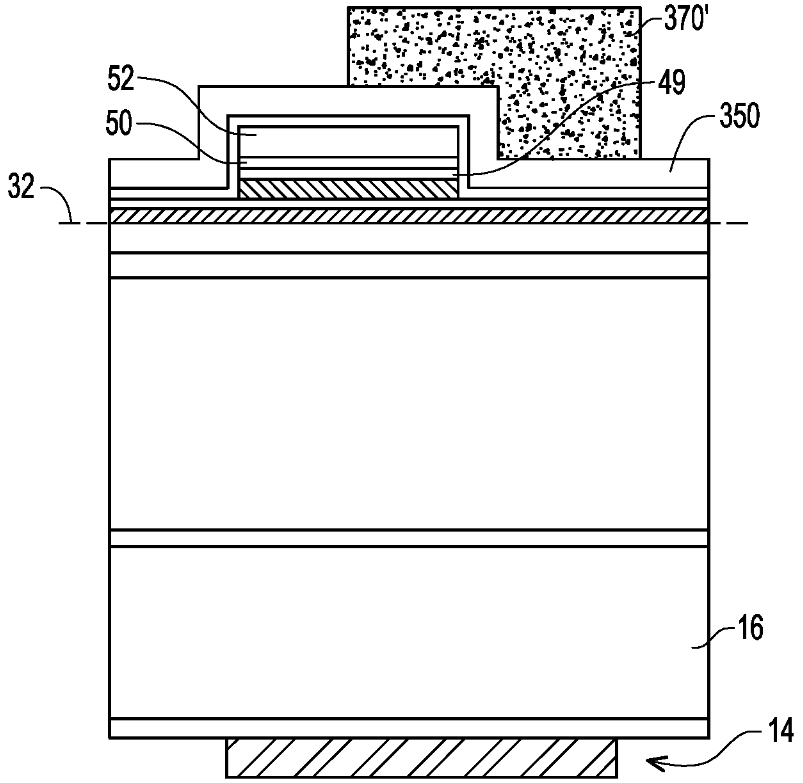
Figure 11B:
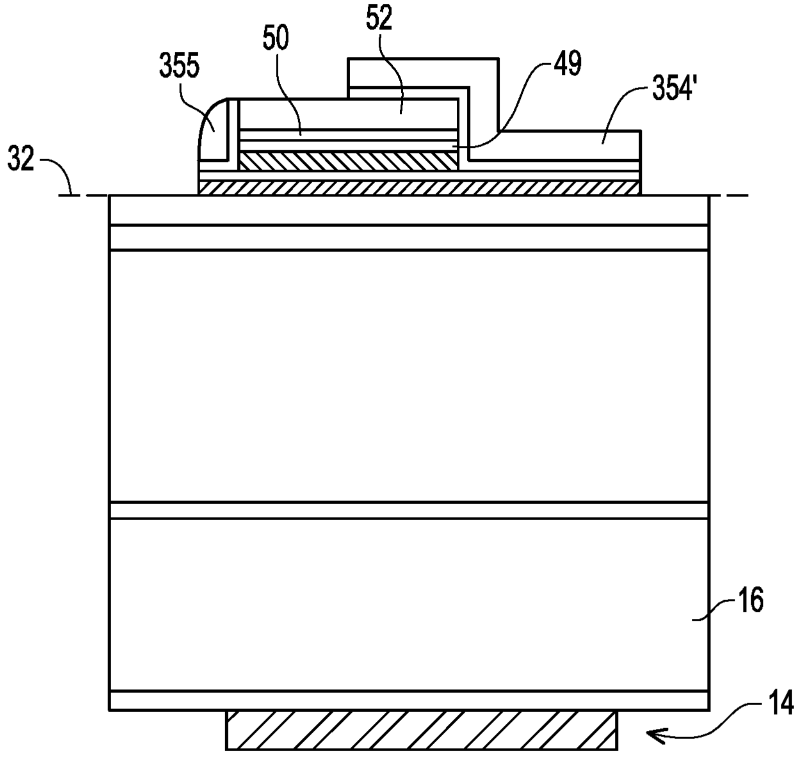

With reference to FIGS. 11A and 11B, further processing for the embodiment of FIG. 8 is shown. FIG. 11A shows the structure after deposition and patterning of photoresist 370' for protecting the cap structure. In this embodiment, the patterned photoresist 370' only partially covers the cap structure. FIG. 10B shows the structure after etching and subsequent removal of the photoresist, leaving the surrounding SiN structure 354' where the photoresist 370' was protecting the structure, and producing the self-aligned sidewall 255 on the portion of the cap structure that was not protected by the photoresist. As in this embodiment the photoresist 370' is not present on the side where the self-aligned sidewall 255 is formed, the tolerance of the lithography for patterning the photoresist is not relevant, which can enable closer cap-to-cap spacing between the 3D-MIM capacitor 22 and the 2D-MIM capacitor 324'.

After the formation of the structure shown in FIG. 10B (for fabricating the embodiment of FIG. 7) or the structure shown in FIG. 11B (for fabricating the embodiment of FIG. 8), BEOL processing continues by depositing further dielectric material on the cap structure and forming the vias, as previously described with reference to FIG. 2H.

With returning reference to FIGS. 7 and 8, one advantage of employing the combination of the 3D-MIM capacitor 22 and the 2D-MIM capacitor 324 or 324' is that there is space below the 2D-MIM capacitor 324 or 324', which is available for other purposes such as routing of electrical conductors 390 another patterned metallization layer.

Figure 12:
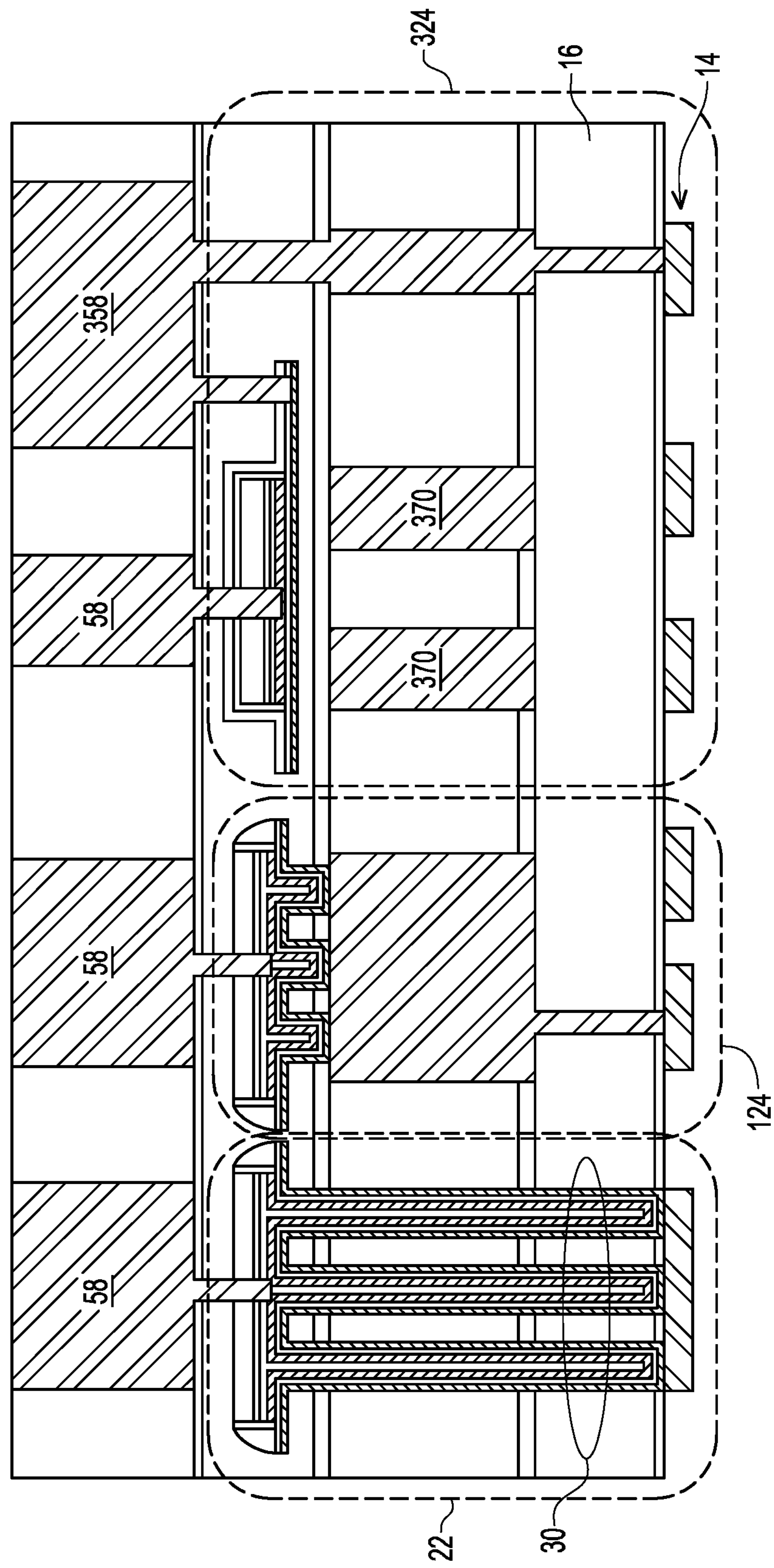
FIG. 12 diagrammatically illustrates a sectional view of three MIM capacitors according to an embodiment.
Figure 13:
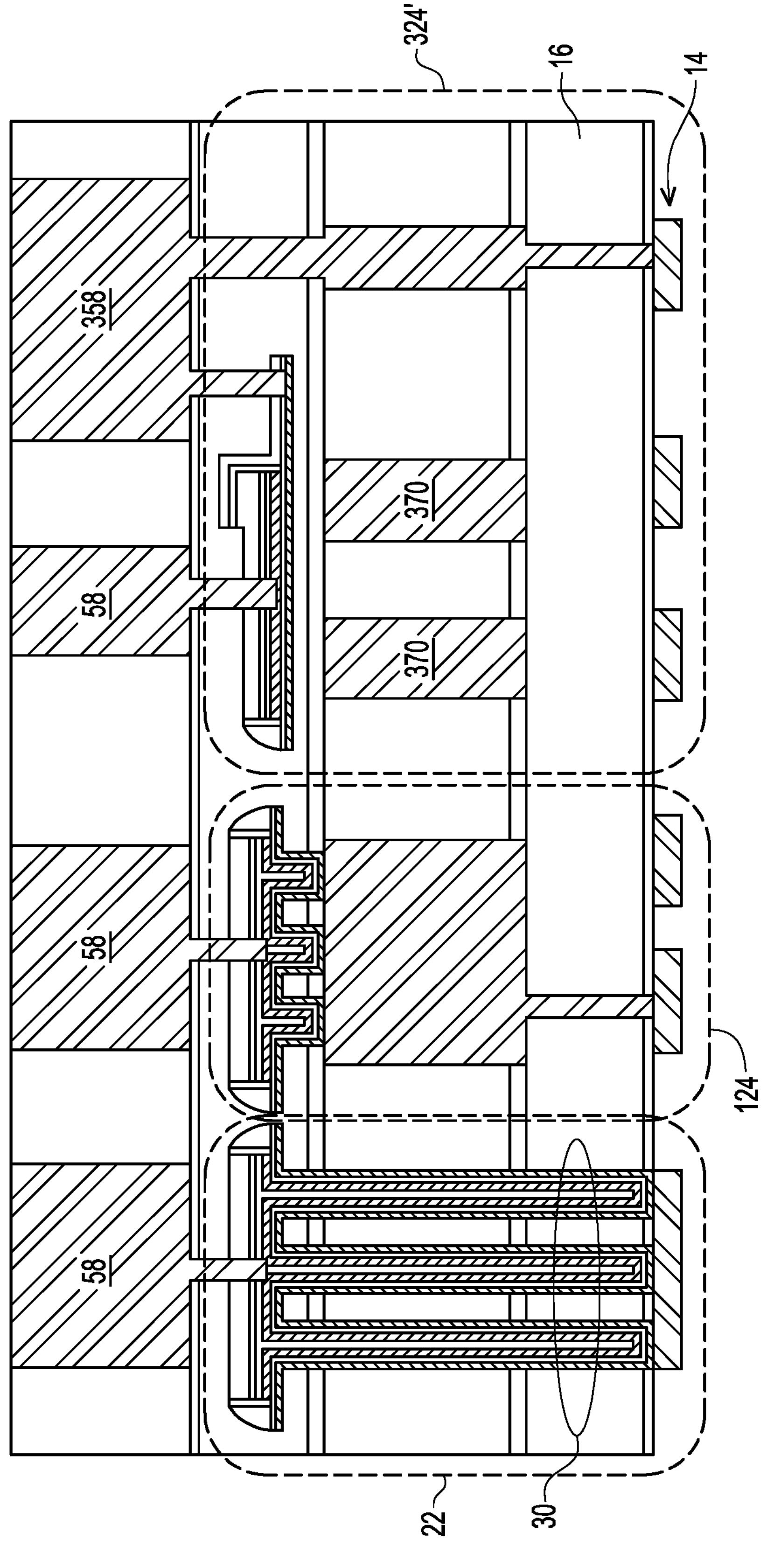
FIG. 13 diagrammatically illustrates a sectional view of three MIM capacitors according to an embodiment.
Figure 14:
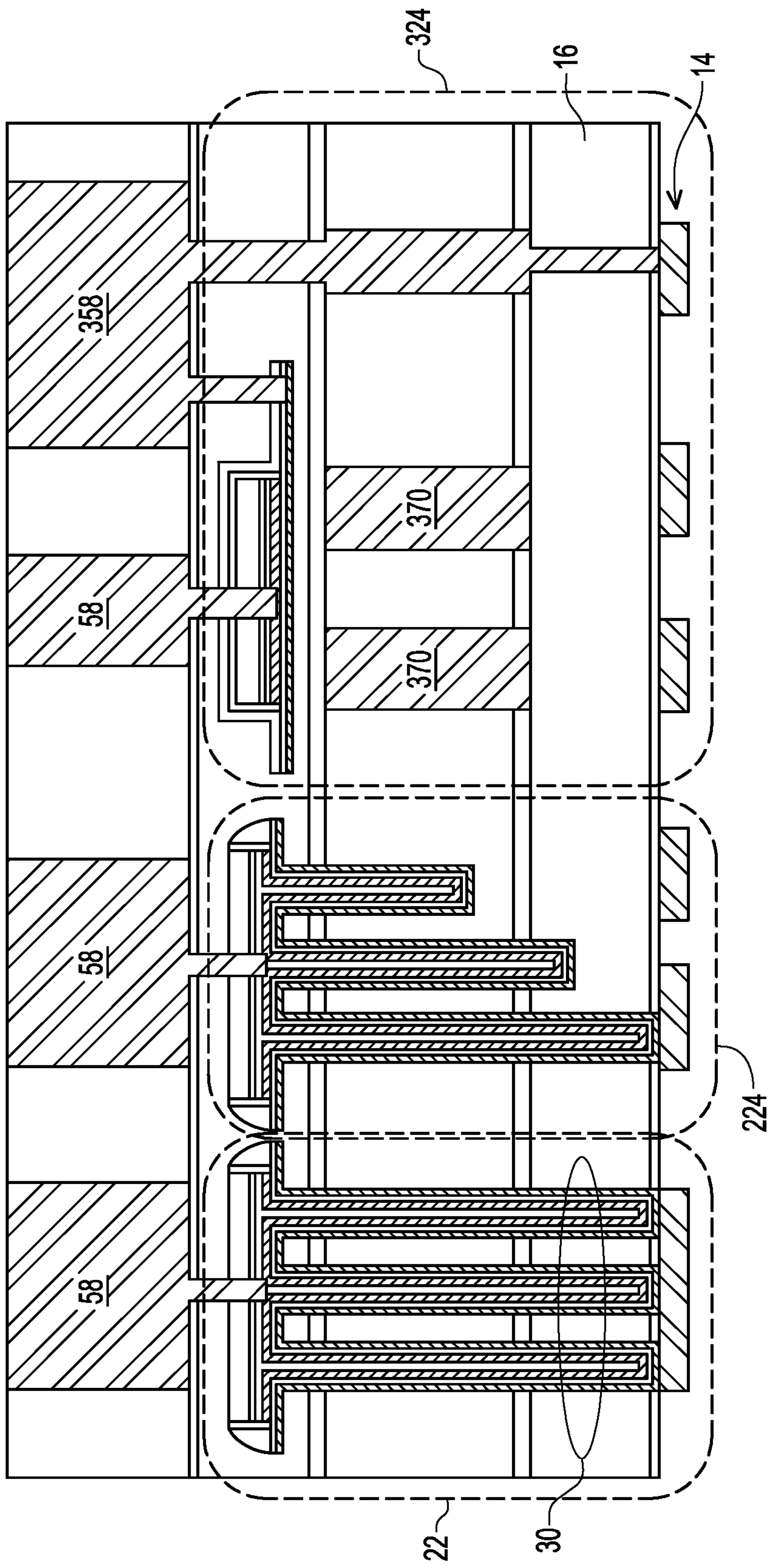
FIG. 14 diagrammatically illustrates a sectional view of three MIM capacitors according to an embodiment.
Figure 15:
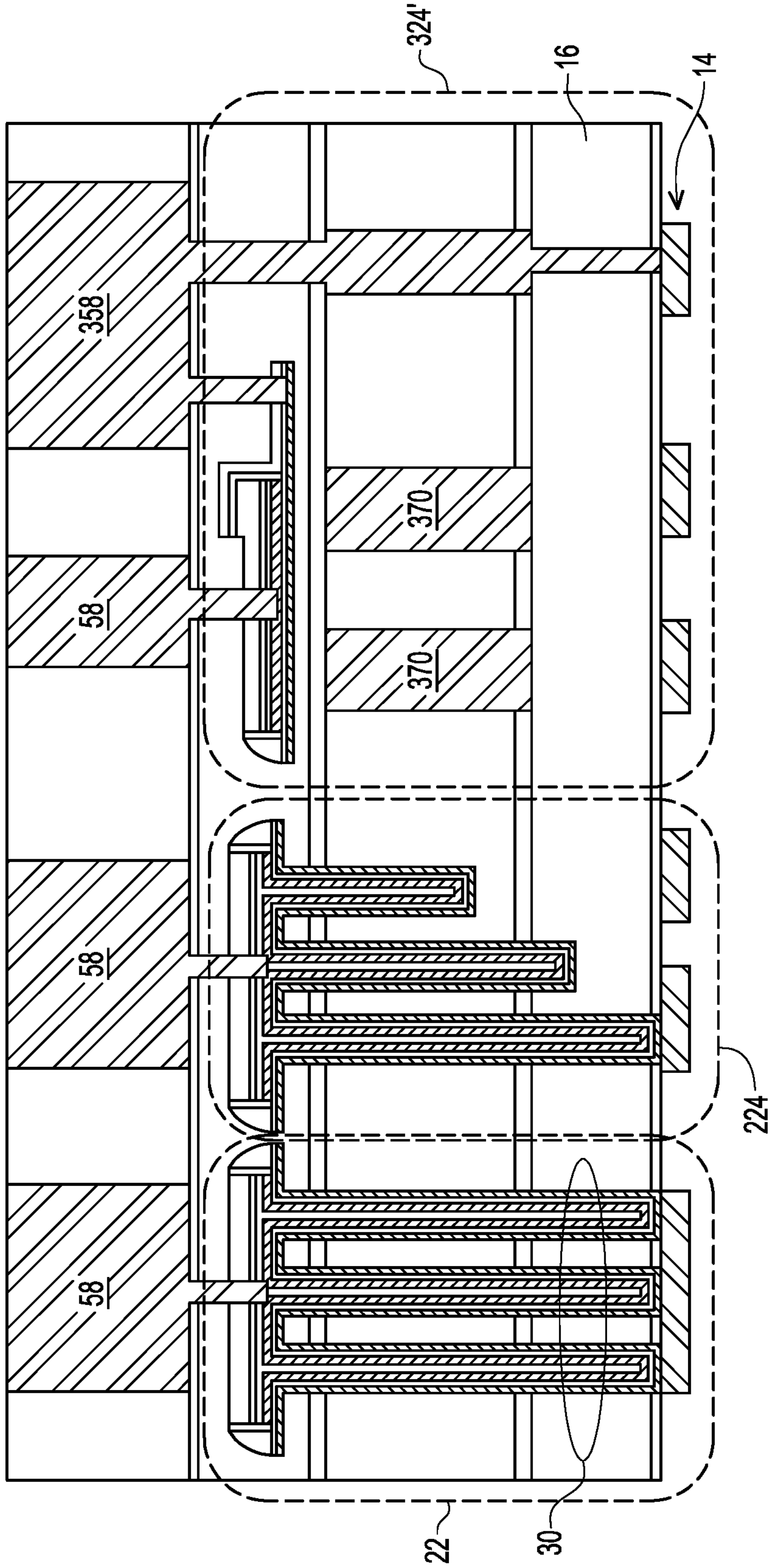
FIG. 15 diagrammatically illustrates a sectional view of three MIM capacitors according to an embodiment.

With reference to FIGS. 12-15, it will be appreciated that instances of the deep 3D-MIM capacitor 22 can be combined with instances of various embodiments of second capacitors providing lower capacitance of various values. For example, FIG. 12 shows an embodiment in which an instance of the deep 3D-MIM capacitor 22 is combined with an instance of the shallow 3D-MIM capacitor 124 of FIG. 3 and an instance of the 2D-MIM capacitor 324 of FIG. 7. FIG. 13 shows an embodiment in which an instance of the deep 3D-MIM capacitor 22 is combined with an instance of the shallow 3D-MIM capacitor 124 of FIG. 3 and an instance of the 2D-MIM capacitor 324' of FIG. 8. FIG. 14 shows an embodiment in which an instance of the deep 3D-MIM capacitor 22 is combined with an instance of the variable shallow 3D-MIM capacitor 224 of FIG. 4 and an instance of the 2D-MIM capacitor 324 of FIG. 7. FIG. 15 shows an embodiment in which an instance of the deep 3D-MIM capacitor 22 is combined with an instance of the variable shallow 3D-MIM capacitor 224 of FIG. 4 and an instance of the 2D-MIM capacitor 324' of FIG. 8. It will be appreciated that these are merely some nonlimiting illustrative examples, and that other combinations can be similarly constructed. Advantageously, such combinations provide for fine tuning of the capacitance values available for the circuit design in the BEOL processing, and in the case of 2D-MIM capacitors also provides valuable space for other-usage metallization routings 370.

In the following, some further embodiments are described.

In a nonlimiting illustrative embodiment, a method of fabricating a metal-insulator-metal (MIM) capacitor structure comprises: forming a patterned metallization layer; disposing a dielectric material on the patterned metallization layer; etching one or more deep trenches through the dielectric material to the patterned metallization layer; depositing a MIM multilayer on the dielectric material and inside the one or more deep trenches formed in the dielectric material, the MIM multilayer including a first conductive layer, a second conductive layer, and a dielectric layer interposed between the first conductive layer and the second conductive layer; and fabricating at least one three-dimensional metal-insulator-metal (3D MIM) capacitor comprising a portion of the MIM multilayer deposited inside at least one of the one or more deep trenches; and fabricating at least one second capacitor. The at least one second capacitor includes at least one of: (i) at least one shallow 3D MIM capacitor comprising a portion of the MIM multilayer deposited inside one or more shallow trenches that pass partway through the dielectric material and that are shallower than the one or more deep trenches, and/or (ii) at least one two-dimensional metal-insulator-metal (2D MIM) capacitor comprising a portion of the MIM multilayer deposited on the dielectric material.

In a nonlimiting illustrative embodiment, a method of fabricating a metal-insulator-metal (MIM) capacitor structure comprises: forming a patterned metallization layer; disposing a dielectric material on the patterned metallization layer; etching one or more deep trenches through the dielectric layer using the patterned metallization layer as an etch stop for the etching; etching one or more shallow trenches partway through the dielectric layer, wherein the one or more shallow trenches are shallower than the one or more deep trenches; depositing a MIM multilayer inside the one or more deep trenches and inside the one or more shallow trenches; fabricating at least one deep three-dimensional metal-insulator-metal (3D MIM) capacitor comprising the MIM multilayer deposited in the one or more deep trenches and not comprising the MIM multilayer deposited in the one or more shallow trenches; and fabricating at least one shallow 3D MIM capacitor comprising the MIM multilayer deposited in the one or more shallow trenches.

In a nonlimiting illustrative embodiment, a metal-insulator-metal (MIM) capacitor structure comprises: a patterned metallization layer; a dielectric material disposed on the patterned metallization layer; at least one three-dimensional metal-insulator-metal (3D MIM) capacitor comprising one or more deep trench capacitors that pass through the dielectric material and contact the patterned metallization layer; and at least one second capacitor. The at least one second capacitor includes at least one of: (i) a shallow 3D MIM capacitor comprising at least one shallow trench capacitor that passes partway through dielectric material and does not contact the patterned metallization layer; and/or (ii) a two-dimensional metal-insulator-metal (2D MIM) capacitor disposed on the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a metal-insulator-metal (MIM) capacitor structure, the method comprising:
- forming a patterned metallization layer;
- disposing a dielectric material on the patterned metallization layer;
- etching one or more deep trenches through the dielectric material to the patterned metallization layer;
- depositing a MIM multilayer on the dielectric material and inside the one or more deep trenches formed in the dielectric material, the MIM multilayer including a first conductive layer, a second conductive layer, and a dielectric layer interposed between the first conductive layer and the second conductive layer;
- fabricating at least one three-dimensional metal-insulator-metal (3D-MIM) capacitor comprising a portion of the MIM multilayer deposited inside at least one of the one or more deep trenches; and
- fabricating at least one second capacitor including at least one shallow 3D-MIM capacitor comprising a portion of the MIM multilayer deposited inside one or more shallow trenches that pass partway through the dielectric material and that are shallower than the one or more deep trenches.

2. The method of claim 1, wherein the at least one second capacitor includes at least one shallow 3D-MIM capacitor and the method further comprises:
- etching the one or more shallow trenches that pass partway through the dielectric material, wherein a portion of the MIM multilayer is deposited inside the one or more shallow trenches.

3. The method of claim 2, wherein the at least one shallow 3D-MIM capacitor further comprises a portion of the MIM multilayer deposited inside at least one of the one or more deep trenches.

4. The method of claim 2, further comprising:
- forming a metal region embedded in the dielectric material, the metal region being isolated from the patterned metallization layer by the dielectric material;

wherein the metal region serves as an etch stop for the etching of the one or more shallow trenches.

5. The method of claim 2, further comprising:

prior to the etching of the one or more shallow trenches, forming a blocking layer on the dielectric material;

wherein at least one shallow trench of the one or more shallow trenches is etched through the blocking layer and each shallow trench has a depth controlled by a thickness of the blocking layer at a location of the shallow trench.

6. The method of claim 5, wherein:

the blocking layer has nonuniform thickness; and the at least one shallow trench that is etched through the blocking layer includes a first shallow trench of a first depth and a second shallow trench of a second depth that is different from the first depth.

7. The method of claim 5, wherein at least one shallow trench of the one or more shallow trenches is not etched through the blocking layer and has a depth that is greater than any shallow trench that is etched though the blocking layer.

8. The method of claim 5, further comprising:

after the etching of the one or more shallow trenches and before the fabricating of the at least one second capacitor, removing the blocking layer.

9. The method of claim 1, wherein the at least one second capacitor further includes at least one two-dimensional metal-insulator-metal (2D-MIM) capacitor comprising a portion of the MIM multilayer deposited on the dielectric material.

10. The method of claim 9, further comprising:

forming one or more metal traces embedded in the dielectric material and that pass between the 2D-MIM and metallization layer.

11. The method of claim 1, further comprising:

fabricating one or more transistors on and/or in a semiconductor wafer; and after the fabrication of the one or more transistors, forming a patterned metallization layers stack including the patterned metallization layer on the semiconductor wafer.

12. A method of fabricating a metal-insulator-metal (MIM) capacitor structure, the method comprising:

forming a patterned metallization layer;

disposing a dielectric material on the patterned metallization layer;

etching one or more deep trenches through the dielectric layer using the patterned metallization layer as an etch stop for the etching;

etching one or more shallow trenches partway through the dielectric layer, wherein the one or more shallow trenches are shallower than the one or more deep trenches;

depositing a MIM multilayer inside the one or more deep trenches and inside the one or more shallow trenches;

fabricating at least one deep three-dimensional metal-insulator-metal (3D-MIM) capacitor comprising the MIM multilayer deposited in the one or more deep trenches and not comprising the MIM multilayer deposited in the one or more shallow trenches; and fabricating at least one shallow 3D-MIM capacitor comprising the MIM multilayer deposited in the one or more shallow trenches.

13. The method of claim 12, wherein the at least one shallow 3D-MIM capacitor further comprises the MIM multilayer deposited in at least one deep trench of the one or more deep trenches.

14. The method of claim 12, further comprising:

forming a metal region embedded in the dielectric material, the metal region being isolated from the patterned metallization layer by the dielectric material;

wherein the etching of the one or more shallow trenches includes etching the one or more shallow trenches partway through the layer stack using the second patterned metallization layer as an etch stop for the etching.

15. The method of claim 14, further comprising:

prior to the etching of the one or more shallow trenches, forming a blocking layer on the dielectric material, wherein at least one shallow trench of the one or more shallow trenches is etched through the blocking layer; and after the etching of the one or more shallow trenches and before the fabricating at least one shallow 3D-MIM capacitor, removing the blocking layer.

16. The method of claim 12, wherein:

prior to the etching of the one or more shallow trenches, forming a blocking layer of nonuniform thickness on the dielectric material; and the one or more shallow trenches include a first shallow trench etched through a first portion of the blocking layer to a first depth and a second shallow trench etched through a second portion of the blocking layer to a second depth;

wherein the first portion of the blocking layer has a greater thickness than the second portion of the blocking layer and the first depth is smaller than the second depth.

17. The method of claim 12, further comprising:

prior to the etching of the one or more shallow trenches, forming a blocking layer on the second dielectric material;

wherein at least one shallow trench of the one or more shallow trenches is etched through the blocking layer; and wherein at least one shallow trench of the one or more shallow trenches is not etched through the blocking layer and has a depth that is greater than any of the shallow trenches that are etched though the blocking layer.

18. The method of claim 12, wherein the MIM multilayer is further deposited on a surface of the dielectric material, and the method further comprises:

fabricating at least one two-dimensional metal-insulator-metal (2D-MIM) capacitor comprising the MIM multilayer deposited on the dielectric material.

19. The method of claim 12, further comprising:

performing front end-of-line (FEOL) processing on a semiconductor wafer to fabricate devices of an integrated circuit; and after the FEOL processing, performing back end-of-line (BEOL) processing to fabricate a stack of patterned metallization layers interconnecting the devices of the integrated circuit, the BEOL processing including the forming of the patterned metallization layer, the disposing of the dielectric material on the patterned metallization layer, the etching one or more deep trenches, the etching of the one or more shallow trenches, the depositing of the MIM multilayer, the fabricating of the at least one deep 3D-MIM capacitor, and the fabricating of the at least one shallow 3D-MIM capacitor.

20. A method of fabricating a metal-insulator-metal (MIM) capacitor structure, the method comprising:

fabricating devices of an integrated circuit on a semiconductor wafer; and forming a stack of patterned metallization layers and interconnecting electrically conductive vias on the semiconductor wafer, including:

forming a patterned metallization layer;

disposing a dielectric material on the patterned metallization layer;

etching one or more deep trenches through the dielectric material to the patterned metallization layer;

depositing a MIM multilayer on the dielectric material and inside the one or more deep trenches formed in the dielectric material, the MIM multilayer including a first conductive layer, a second conductive layer, and a dielectric layer interposed between the first conductive layer and the second conductive layer;

fabricating at least one three-dimensional metal-insulator-metal (3D-MIM) capacitor comprising a portion of the MIM multilayer deposited inside at least one of the one or more deep trenches; and fabricating at least one second capacitor including at least one shallow 3D-MIM capacitor comprising a portion of the MIM multilayer deposited inside one or more shallow trenches that pass partway through the dielectric material and that are shallower than the one or more deep trenches.

* * * * *